(12) United States Patent
Liu et al.

(10) Patent No.: US 10,418,949 B2
(45) Date of Patent: Sep. 17, 2019

(54) LOW NOISE AMPLIFIER AND RADIO FREQUENCY AMPLIFICATION METHOD USING THE SAME

(71) Applicant: Maxscend Microelectronics Company Limited, Wuxi (CN)

(72) Inventors: Wenyong Liu, Wuxi (CN); Weijiang Wang, Wuxi (CN)

(73) Assignee: MAXSCEND MICROELECTRONICS COMPANY LIMITED (CN)

( * ) Notice: Subject to any disclaimer, the term of this patent is extended or adjusted under 35 U.S.C. 154(b) by 0 days.

(21) Appl. No.: 15/954,747

(22) Filed: Apr. 17, 2018

(65) Prior Publication Data

US 2019/0123696 A1   Apr. 25, 2019

(30) Foreign Application Priority Data

Oct. 20, 2017  (CN) .......................... 2017 1 0984080
Oct. 20, 2017  (CN) ...................... 2017 2 1356345 U

(51) Int. Cl.
   *H03F 1/22*   (2006.01)
   *H03F 3/195*   (2006.01)
   *H03F 1/26*   (2006.01)

(52) U.S. Cl.
CPC .............. *H03F 3/195* (2013.01); *H03F 1/26* (2013.01); *H03F 2200/06* (2013.01); *H03F 2200/171* (2013.01); *H03F 2200/222* (2013.01); *H03F 2200/249* (2013.01); *H03F 2200/267* (2013.01); *H03F 2200/294* (2013.01); *H03F 2200/297* (2013.01); *H03F 2200/301* (2013.01); *H03F 2200/312* (2013.01); *H03F 2200/451* (2013.01)

(58) Field of Classification Search
CPC ..................................... H03F 1/22; H03F 1/12
USPC .................................................. 330/311, 51
See application file for complete search history.

(56) References Cited

U.S. PATENT DOCUMENTS

| | | | | |
|---|---|---|---|---|
| 6,987,422 B2 * | 1/2006 | Vice | ...................... | H03F 1/0277 330/285 |
| 7,696,828 B2 * | 4/2010 | Chang | ...................... | H03F 1/223 330/283 |
| 8,022,772 B2 * | 9/2011 | Cassia | ...................... | H03F 1/223 330/311 |
| 8,031,005 B2 * | 10/2011 | Xiong | ...................... | H03F 1/223 330/283 |
| 8,102,213 B2 * | 1/2012 | Tasic | ...................... | H03F 1/223 330/283 |

(Continued)

*Primary Examiner* — Henry Choe
(74) *Attorney, Agent, or Firm* — McDonald Hopkins LLC

(57) ABSTRACT

A low noise amplifier and a radio frequency amplification method using the low noise amplifier are provided. The low noise amplifier includes gain stage circuits, the number of which is not less than that of RF signals to be amplified, and the gain stage circuit is configured to independently amplify the RF signal when being enabled; a plurality of amplification selection switching circuits, each of which is connected to one of the gain stage circuits and is configured to, according to the RF signal, control the gain stage circuit to be enabled or disabled; a plurality of driving circuits, each of which is connected to a respective one of the plurality of gain stage circuits and is configured to, when the gain stage circuit is enabled, receive at least one RF signal amplified by the gain stage circuit and output the amplified RF signal; and at least one load circuit.

20 Claims, 26 Drawing Sheets

(56) References Cited

U.S. PATENT DOCUMENTS 9,035,697 B2 * 5/2015 Youssef .................... H03F 3/68
330/311
2004/0227576 A1 * 11/2004 Vice ...................... H03F 1/0277
330/285

* cited by examiner

LOW NOISE AMPLIFIER AND RADIO FREQUENCY AMPLIFICATION METHOD USING THE SAME

CROSS-REFERENCES TO RELATED APPLICATIONS

This application claims priority to Chinese patent application No. 201710984080.2, filed on Oct. 20, 2017 and Chinese patent application No. 201721356345.6 filed on Oct. 20, 2017, the disclosure of which are incorporated herein by reference in their entirety.

TECHNICAL FIELD

The present disclosure relates to the field of radio frequency technologies, and, in particular, to a low noise amplifier and a radio frequency amplification method using the low noise amplifier.

BACKGROUND

Wireless devices (such as smart phones) in wireless or mobile communication systems usually employ radio frequency switches for selecting radio frequency channels. For example, the radio frequency switch is configured to select a transmitting channel and a receiving channel in a WiFi or Bluetooth module; and the radio frequency switch is configured for multi-band multi-mode controlling in the mobile communication. The radio frequency switch is more and more important in a design for a radio frequency front end of the wireless mobile terminal device. The low noise amplifier is a device necessarily for the radio frequency front end and is configured for amplifying weak radio frequency (RF) signals received by an antenna, and the amplified RF signals are outputted to a post-amplifier or a mixer for amplification processing or frequency conversion processing.

In the related art, the radio frequency switch and the low noise amplifier are modules separated from each other, which cause more area occupations and large parasitic effects.

SUMMARY

Embodiments of the present disclosure provides a low noise amplifier and a radio frequency amplification method using the low noise amplifier in order to achieve RF switching function and low noise amplification, reduce the area occupied by the low noise amplifier and reduce the parasitic effect.

Embodiments of the present disclosure provide a low noise amplifier. The low noise amplifier includes: a plurality of gain stage circuits, a plurality of amplification selection switching circuits, a plurality of driving circuits, and at least one load circuit.

The number of the plurality of gain stage circuits is equal to or greater than the number of radio frequency (RF) signals to be amplified, and the gain stage circuit is configured to independently amplify the RF signal when being enabled.

Each of the plurality of amplification selection switching circuits is connected to a respective one of the plurality of gain stage circuits and is configured to, according to the RF signal, control the gain stage circuit to be enabled or disabled.

Each of the plurality of driving circuits is connected to a respective one of the plurality of gain stage circuits and is configured to, when the gain stage circuit is enabled, receive at least one RF signal amplified by the gain stage circuit and output the amplified RF signal.

The at least one load circuit is connected to the driving circuit and is configured to output at least one radio frequency (RF) output signal according to the amplified RF signal outputted by the driving circuit.

Embodiments of the present disclosure further provide a radio frequency amplification method using the low noise amplifier and capable of performing RF amplifying and outputting with the low noise amplifier in any embodiment of the present disclosure.

The low noise amplifier further includes at least one bypass circuit. The bypass circuit includes an input terminal and an output terminal. The gain stage circuit includes an input terminal and a first terminal. The driving circuit includes an input terminal and an output terminal. Each of the plurality of amplification selection switching circuits is connected to the input terminal of a respective one of the plurality of gain stage circuit. The input terminal of the driving circuit is connected to the first terminal of the gain stage circuit. The load circuit is connected to the output terminal of the driving circuit.

The input terminal of the bypass circuit is connected to the input terminal of a respective one of the gain stage circuit, the output terminal of the bypass circuit is connected to at least one load circuit, and the bypass circuit is configured to, when being enabled, transmit the RF signal inputted by the input terminal of the gain stage circuit connected thereto to the load circuit.

The radio frequency amplification method includes: in a first operation mode, disabling the bypass circuit and enabling one or more of the plurality of gain stage circuits to output one or more amplified RF signals;

enabling one or more of the plurality of driving circuits to obtain one or more driving radio frequency signals based on the one or more amplified RF signals; and generating one or more radio frequency output signals by one or more load circuits based on the one or more driving radio frequency signals.

Embodiments of the present disclosure further provide a radio frequency amplification method using the low noise amplifier and capable of performing RF amplifying and outputting with the low noise amplifier in any embodiment of the present disclosure.

The low noise amplifier further includes at least one bypass circuit. The bypass circuit includes an input terminal and an output terminal. The gain stage circuit includes an input terminal and a first terminal. The driving circuit includes an input terminal and an output terminal. Each of the plurality of amplification selection switching circuits is connected to the input terminal of a respective one of the plurality of gain stage circuit. The input terminal of the driving circuit is connected to the first terminal of the gain stage circuit. The load circuit is connected to the output terminal of the driving circuit.

The input terminal of the bypass circuit is connected to the input terminal of a respective one of the gain stage circuit, the output terminal of the bypass circuit is connected to at least one load circuit, and the bypass circuit is configured to, when being enabled, transmit the RF signal inputted by the input terminal of the gain stage circuit connected thereto to the load circuit.

The radio frequency amplification method includes: in a second operation mode, disabling the gain stage circuit, and enabling one or more bypass circuits to output one or more radio frequency transmission signals according to the RF signals inputted to the input terminal; and generating one or more radio frequency output signals by one or more load circuits based on the one or more radio frequency transmission signals.

Embodiments of the present disclosure further provide a radio frequency amplification method using the low noise amplifier and capable of performing RF amplifying and outputting with the low noise amplifier in any embodiment of the present disclosure.

The low noise amplifier further includes at least one bypass circuit. The bypass circuit includes an input terminal and an output terminal. The gain stage circuit includes an input terminal and a first terminal. The driving circuit includes an input terminal and an output terminal. Each of the plurality of amplification selection switching circuits is connected to the input terminal of a respective one of the plurality of gain stage circuit. The input terminal of the driving circuit is connected to the first terminal of the gain stage circuit. The load circuit is connected to the output terminal of the driving circuit.

The input terminal of the bypass circuit is connected to the input terminal of a respective one of the gain stage circuit, the output terminal of the bypass circuit is connected to at least one load circuit, and the bypass circuit is configured to, when being enabled, transmit the RF signal inputted by the input terminal of the gain stage circuit connected thereto to the load circuit.

The radio frequency amplification method includes:

if the gain stage circuit is enabled, enabling one or more of the plurality of gain stage circuits to obtain one or more amplified RF signals;

enabling at least one of the plurality of driving circuits to obtain one or more driving RF signals based on the one or more amplified RF signals;

enabling one or more load circuits to generate one or more RF output signals based on the one or more driving RF signals or based on one or more RF transmission signals;

if the bypass circuit is enabled, enabling one or more of the plurality of bypass circuits to obtain one or more RF transmission signals.

According to technical solutions provided by embodiments of this disclosure, the function of radio frequency switch and the function of low noise amplification are achieved through the configurations of the amplification selection switching circuit and the gain stage circuit, the low noise amplifier has the functions both of radio frequency switch and of low noise amplification. There is no need to additionally arrange a radio frequency switch module. Both the function of radio frequency switch and the function of low noise amplification are achieved, thereby reducing the occupied area, reducing the parasitic affection, having a wide applicable range, and being safe and reliable.

DETAILED DESCRIPTION

Figure 1:
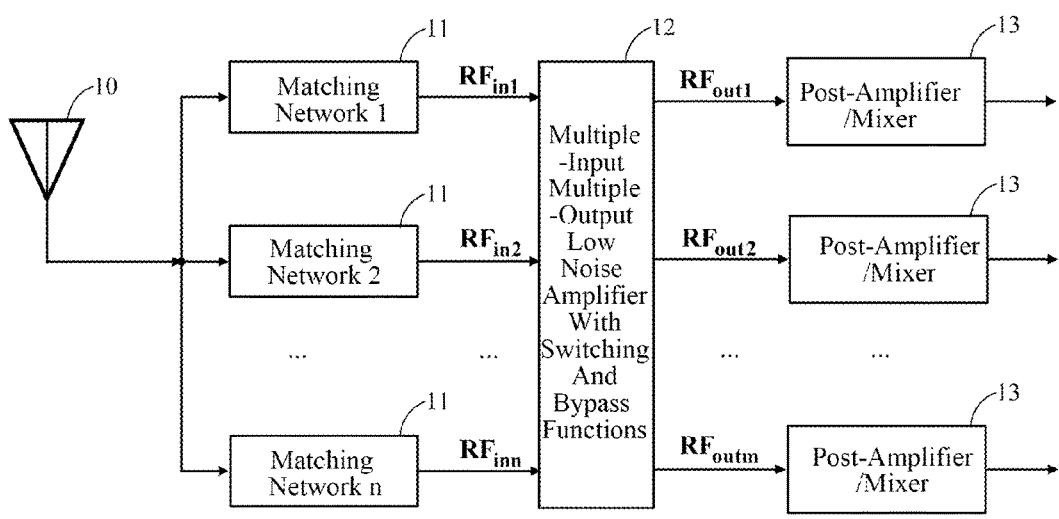
FIG. 1 is a schematic block diagram showing an application of a low noise amplifier according to an embodiment of the present disclosure.

The present disclosure will be further described in detail with reference to the accompanying drawings and embodiments. It is to be understood that the specific embodiments set forth below are intended to explain and not to limit the present disclosure. For ease of description, only a part related to the present disclosure rather than the whole structure is illustrated in the accompanying drawings.

In order to realize both a function of radio frequency switching and a function of low frequency amplification, reduce the occupied area and reduce the parasitic effect, a low noise amplifier provided by an embodiment of the present disclosure includes: a plurality of gain stage circuits, a plurality of amplification selection switching circuits, a plurality of driving circuits and at least one load circuit.

The number of the plurality of gain stage circuits is equal to or greater than the number of radio frequency (RF) signals to be amplified. The gain stage circuits are configured to, when being enabled, individually amplify the RF signals.

Each of the plurality of amplification selection switching circuits is connected to a respective one of the plurality of gain stage circuits. The amplification selection switching circuit is configured to control according to the RF signal the gain stage circuit to be enabled or disabled in order to amplify the RF signal by the enabled gain stage circuit.

Each of the plurality of driving circuits is connected to a respective one of the plurality of gain stage circuits. When the gain stage circuit is enabled, the driving circuit is configured to receive at least one RF signal amplified by the gain stage circuit and output the amplified RF signal to, for example, the load circuit.

The load circuit is connected to the driving circuit and is configured to output at least one radio frequency (RF) output signal according to the amplified RF signal outputted by the driving circuit.

It should be noted that, in the embodiments of the present invention, the terms "the plurality of" and "multiple" refer to two or more than two. For example, a plurality of gain stage circuits refers to two or more gain stage circuits, and multiple gain stage circuits refers to two or more gain stage circuits.

Specifically, multiple gain stage circuits may be employed for receiving the RF signals to be amplified. The RF signals to be amplified are typically small alternating current (AC) signals. The RF signals to be amplified may generally be in a single signal or multiple signals. Each of RF signals to be amplified is inputted into a corresponding gain stage circuit. Each gain stage circuit includes an amplifier capable of independently amplifying each corresponding RF signal. During the specific implementation, the number of the RF signals to be amplified is typically smaller than or equal to that of the amplifiers. When the RF signal is to be amplified, it is necessary to enable the gain stage circuit corresponding to the RF signal to be amplified by the amplification selection switching circuit. That is, the amplification selection switching circuit can enable the amplifiers in one or more gain stage circuits according to the RF signal to be amplified. When the gain stage circuit is not enabled, the amplifier in the gain stage circuit is typically at the turned-off state. One terminal of the driving circuit is connected to the gain stage circuit and the other terminal is connected to the load circuit. One terminal of the load circuit is connected to the driving circuit and a bypass circuit and the other terminal is connected to the power source voltage VDD. The magnitude of the power source voltage VDD is determined and selected as need. After being amplified by the amplifier in the gain stage circuit, the RF signal is transmitted to the load circuit through the driving circuit, and the RF output signal is outputted via a radio frequency signal amplification output terminal through the load circuit. Through the connection configurations of the amplification selection switching circuits and the gain stage circuits, both the functions of radio frequency switch and low noise amplification are achieved, the low noise amplifier has both the functions of radio frequency switch and the ability of low noise amplification, without the need to arrange the radio frequency switch module individually, thereby achieving the effects of reducing the area occupied by the circuit and reducing the parasitic affection.

Further, the low noise amplifier further includes at least one bypass circuit. The bypass circuit includes an input terminal and an output terminal. The gain stage circuit includes an input terminal and a first terminal. The driving circuit includes an input terminal and an output terminal. Each amplification selection switching circuit is connected to the input terminal of a respective gain stage circuit. The input terminal of the driving circuit is connected to the first terminal of the gain stage circuit, and the output terminal of the driving circuit is connected to the load circuit. The input terminal of the bypass circuit is connected to the input terminal of a respective gain stage circuit, and the output terminal of the bypass circuit is connected to at least one load circuit. The bypass circuit is configured to, when being enabled, output an radio frequency (RF) transmission signal to the load circuit connected thereto according to the RF signal inputted to the input terminal of the bypass circuit.

The load circuit is further configured to receive the RF transmission signal transmitted by the bypass circuit and provide at least one radio frequency (RF) output signal according to the RF transmission signal.

The bypass circuit is configured to mitigate the output distortion caused by the excessive amplitude of the RF signal.

Specifically, in a first operation mode, the bypass circuit is disabled, and the RF signal to be amplified may be received by one or more gain stage circuits electrically connected to the disabled bypass circuit. The one or more gain stage circuit output the amplified RF signal to the load circuit. The load circuit outputs the RF output signal according to the amplified RF signal, thereby achieving the individual transmissions of the RF signals by the gain stage circuits.

In a second operation mode, the gain stage circuits are disabled, one or more bypass circuits in the plurality of bypass circuits are enabled to obtain one or more radio frequency transmission signals, the radio frequency transmission signal is transmitted to the load circuit connected to the enabled bypass circuit, and the load circuit outputs the RF output signal according to the RF transmission signal, thereby achieving the individual transmissions of RF signals in the bypass circuit.

In a third operation mode, one or more of the plurality of gain stage circuits are enabled, so that one or more amplified RF signals are obtained, the amplified RF signals are transmitted to the load circuits via the driving circuit, the load circuits output the RF output signals according to the amplified RF signals. One or more of the plurality of bypass circuits are enabled, one or more RF transmission signals are obtained, the RF transmission signals are transmitted to the load circuit connected to the enabled bypass circuit, and the load circuit outputs the RF output signals according to the RF transmission signals.

The low noise amplifier provided by embodiments of the present disclosure may be multiple-input multiple-output with switching and bypass functions.

Each gain stage circuit may include an amplifier circuit. The amplifier circuit includes a gain transistor. The RF signal is applied to a control electrode of the gain transistor. The control electrode of the gain transistor is connected to the amplification selection switching circuit and the input terminal of the bypass circuit, and a drain electrode of the gain transistor is connected to the driving circuit.

The low noise amplifier may further include at least one coupling circuit. The gain stage circuit further includes a second terminal. The second terminal of each gain stage circuit is further connected to a coupling circuit which is grounded.

The plurality of amplification selection switching circuits are connected to the plurality of gain stage circuits in one-to-one correspondence. The amplification selection switching circuit may include a power source switch, a selection resistor and a grounding switch. One terminal of the power source switch is connected to a bias voltage, the other terminal of the power source electrode is connected to one terminal of the grounding switch and connected to the corresponding gain stage circuit through the selection resistor, and the other terminal of the grounding switch is grounded.

The driving circuit may include at least one driving transistor. A first electrode of each driving transistor is connected to a respective gain stage circuit, a second electrode is connected to a respective load circuit, a control electrode is configured to receive a control voltage, and the driving transistor is enabled or disabled according to the control voltage.

The bypass circuit may include at least one bypass selection switch and at least one bypass coupling capacitor. One terminal of the bypass selection switch is connected to the input terminal of the gain stage circuit, and the other terminal of the bypass selection switch is connected to the load circuit through the bypass coupling capacitor.

During specific implementation, the bypass coupling switch, the power source switch in the amplification selection switching circuit and the grounding switch may receive control signals and be turned on or turned off according to the received control signals. The control signals may be supplied by corresponding control signal generation circuits. That is, the control signal generation circuits can individually control the bypass coupling switch, the power source switch in the amplification selection switching circuit and the grounding switch. The bypass coupling capacitors and the bypass coupling switches in the bypass branches are connected in one-to-one correspondence. That is, it is realized that the bypass coupling capacitor in the bypass branch individually transmits the RF signal to be transmitted. Moreover, the amplification selection switching circuits and the amplifiers in the gain stage circuits are connected in one-to-one correspondence, thereby achieving that the amplifier in the gain stage circuit individually amplifies each RF signal to be amplified.

When the control signal of the control signal generation circuit causes the power source switch to be closed, the gain stage circuit is enabled, and the grounding switch and the bypass coupling switch are controlled to be open, such that the gain stage circuit amplify and output the RF signal. When the control signal of the control signal generation circuit causes the power source switch to be open, the gain stage circuit is disabled, and when the grounding switch and the bypass coupling switch are closed, the bypass coupling capacitor in the bypass branch is conducted, thereby achieving the transmission of RF signal by the bypass circuit.

The ability of radio frequency switch and the ability of low noise amplification are achieved through the connection and corporation of the amplification selection switching circuit and the gain stage circuit. Moreover, the output distortion caused by over large amplitude of the RF signal is mitigated through the connection and corporation of the amplification selection switching circuit and the gain stage circuit, thereby achieving the ability of radio frequency switch, the ability of low noise amplification, and the objects of reducing the occupied area and reducing the parasitic influences at the same time.

Specifically, in the first operation mode, the second operation mode and the third operation mode, a voltage switch and the grounding switch may be controlled to be open or closed by the control signal outputted by the control signal generation circuit, such that the gain stage circuit is enabled or disabled. The bypass coupling switch is controlled to be open or closed by the control signal outputted by the control signal generation circuit, such that the bypass circuit is enabled or disabled. Exemplarily, when the control signal outputted by the control signal generation circuit causes the power source switch to be closed and causes the grounding switch to be open, the gain stage circuit is enabled, and when the bypass coupling switch is open, the gain stage circuit amplifies the RF signal and outputs the amplified RF signal to the driving circuit, the amplified RF signal is further transmitted to the load circuit, and the RF output signal is outputted, thereby achieving outputting the RF signal and achieving the independent transmission of each RF signal to be transmitted by the gain stage circuit. When the control signal outputted by the control signal generation circuit causes the power source switch to be open, the gain stage circuit is disabled, and when the grounding switch and the bypass coupling switch are closed, the bypass coupling capacitor in the bypass branch is caused to be conducted, thereby achieving the transmission of the RF signal. During specific implantation, the bypass coupling switch in the bypass branch is individually controlled by the control signal outputted by the control signal generation circuit, the bypass coupling capacitors and the bypass coupling switches in the bypass branches are connected in one-to-one correspondence, that is, it is achieved that each RF signal to be transmitted is individually transmitted by the bypass coupling capacitors in the bypass branches.

Further, the gain stage circuit is further connected to a coupling circuit for grounding. In embodiments of the present disclosure, the coupling circuit includes a coupling inductor. The coupling inductor includes one or more of an on chip inductor, an encapsulation inductor, a discrete device inductor and a bond-wire inductor.

The load circuit may include one or more of a load inductor, a load capacitor, a load resistor, a balun and a transistor. All amplified RF signals are driven by the driving circuits so as to obtain the RF output signals at the RF signal amplification output terminal.

In embodiments of the present disclosure, in the first operation mode, the bypass circuit is disabled, the RF signal to be amplified is applied to the control electrode of the gain transistor which is connected to the bypass coupling switch in the bypass circuit and also connected to the grounding switch through connecting the selection resistor, and a source electrode of the gain transistor is grounded through the coupling circuit. In addition, the number of the coupling circuits is one or is consistent with the number of gain transistors in the gain circuits. Switching states of the power source switch, the bypass coupling switch and the grounding switch are controlled by the control signal generation circuit, the specific form of the control signal generation circuit may be selected and determined as need, specifically, the specific form is determined by those skilled in the art. When the bypass coupling switch is open by the control signal of the control signal generation circuit, the bypass circuit is disabled. Moreover, the power source switch is closed and the grounding switch is opened, causing the gain transistor connected to the amplification selection circuit is turned on, such that the RF signal to be amplified is amplified through the gain transistor. During specific implantation, the control signal generation circuit can independently control the amplification selection circuits in the amplification selection switching circuits, the amplifiers in the gain stage circuits and the amplification selectors in the amplification selection switching circuits are connected in one-to-one correspondence, thereby achieving that each RF signal to be amplified is independently amplified by the amplifiers in the gain stage circuits. The operation frequencies or the frequency bands of the RF signals to be amplified may be the same or different, and are selected and determined as specific needs, which are not described herein again.

FIG. 1 is a schematic block diagram showing an application of a low noise amplifier according to an embodiment of the present disclosure. N (N≥2) RF signals to be amplified ($RF_{in1}$, $RF_{in2}$, ..., $RF_{inn}$) are formed by a matching network 11 and an antenna 10, and then applied to the multiple-input multiple-output low noise amplifier 12 with switching and bypass functions provided in embodiments of the present disclosure. M (M≥1) RF output signals ($RF_{out1}$, $RF_{out2}$, ..., $RF_{outn}$) outputted by RF signal amplification output terminals are amplified or mixed by a post-amplifier/mixer 13 and then are outputted. The roles and purposes of the matching network 11 and the post-amplifier/mixer 13 are well known to those skilled in the art, and will not be described in detail here.

Further, the bypass circuit is provided between the RF signal amplification output terminal and the input terminal of the gain stage circuit configured for receiving the RF signal. The bypass circuit is used for mitigating the output distortion caused by the excessive amplitude of the RF signal. The bypass circuit may include bypass branches of which the number corresponds to the number of the RF signals to be amplified. The bypass branches are correspondingly connected with the amplification selection switching circuits and the gain stage circuits. The bypass circuit includes a bypass selection switch. One terminal of the bypass selection switch is connected to the amplification selection switching circuit and the gain stage circuit, and the other terminal of the bypass selection switch is connected to the RF signal amplification output terminal via a bypass coupling capacitor.

In embodiments of the present disclosure, when the amplitude of the RF signal to be amplified is too large, the RF output signal outputted by the RF signal amplification output terminal is distorted after the RF signal to be amplified passes through the gain stage circuit and the driving circuit. At this time, the amplification selection switching circuit does not select any amplifier of the plurality of gain stage circuits. That is, all the amplifiers of the gain stage circuits are in the off state, and the RF signals to be amplified are applied to the RF signal amplification output terminals through the bypass circuit. The switching state of the bypass selection switch is also controlled by the control signal generation circuit. When the control signal generated by the control signal generation circuit causes the bypass selection switch to be closed, and the grounding switch of the amplification selection switching circuit is grounded, the RF signal to be amplified which is connected to the bypass selection switch is transmitted to the RF signal amplification output terminal through the bypass coupling capacitor. The bypass coupling capacitor is an AC coupling/DC blocking capacitor.

Figure 2:
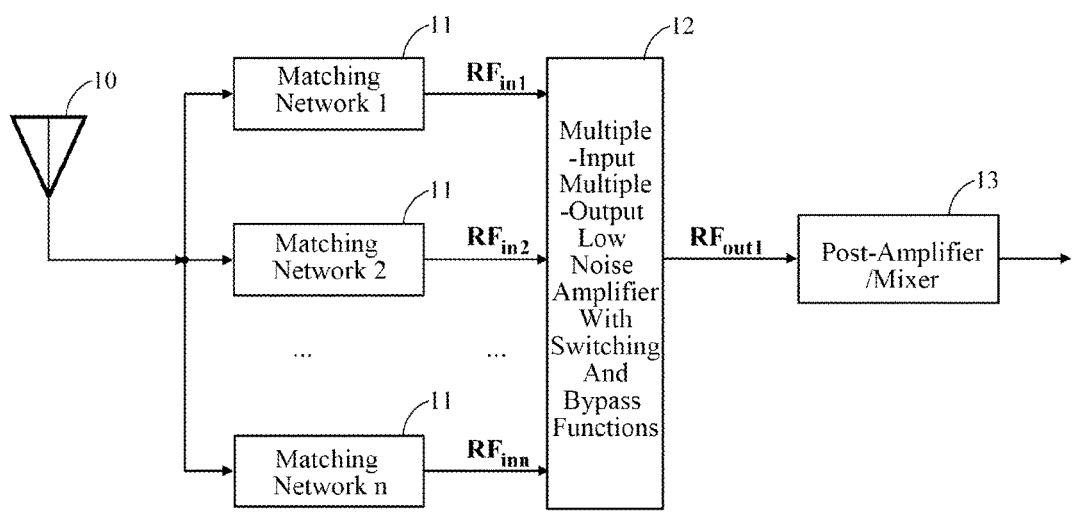
FIG. 2 is a schematic block diagram showing another application of a low noise amplifier according to an embodiment of the present disclosure.

FIG. 2 is a schematic block diagram showing another application of a low noise amplifier according to an embodiment of the present disclosure. The schematic block diagram of the multiple-input multiple-output low noise amplifier with switching and bypass functions in FIG. 2 corresponds to a specific configuration of FIG. 1 in which N≥2 and m=1. In this configuration, N RF signals to be amplified ($RF_{in1}$, $RF_{in2}$, ..., $RF_{inn}$) are formed by the matching network 11 and the antenna 10, and then applied to the multiple-input multiple-output low noise amplifier 12 with switching and bypass functions in embodiments of the present disclosure. M (M=1) RF output signal $RF_{out1}$ outputted by the RF signal amplification output terminal is amplified or mixed by a post-amplifier/mixer 13 and then are outputted. The roles and purposes of the matching network 11 and the post-amplifier/mixer 13 are well known to those skilled in the art, and will not be described in detail here. In addition, the functional components of the schematic block diagram in FIG. 2 and the application methods are similar to those in FIG. 1, and details are not described herein again.

In embodiments of the present disclosure, the multiple-input multiple-output low noise amplifier with switching and bypass functions may be implemented with various circuit architectures, or may be implemented with various types of active and passive devices. Some specific embodiments of the low noise amplifier with switches implemented with N-channel metal-oxide-semiconductor (NMOS) transistors are described below.

Figure 3:
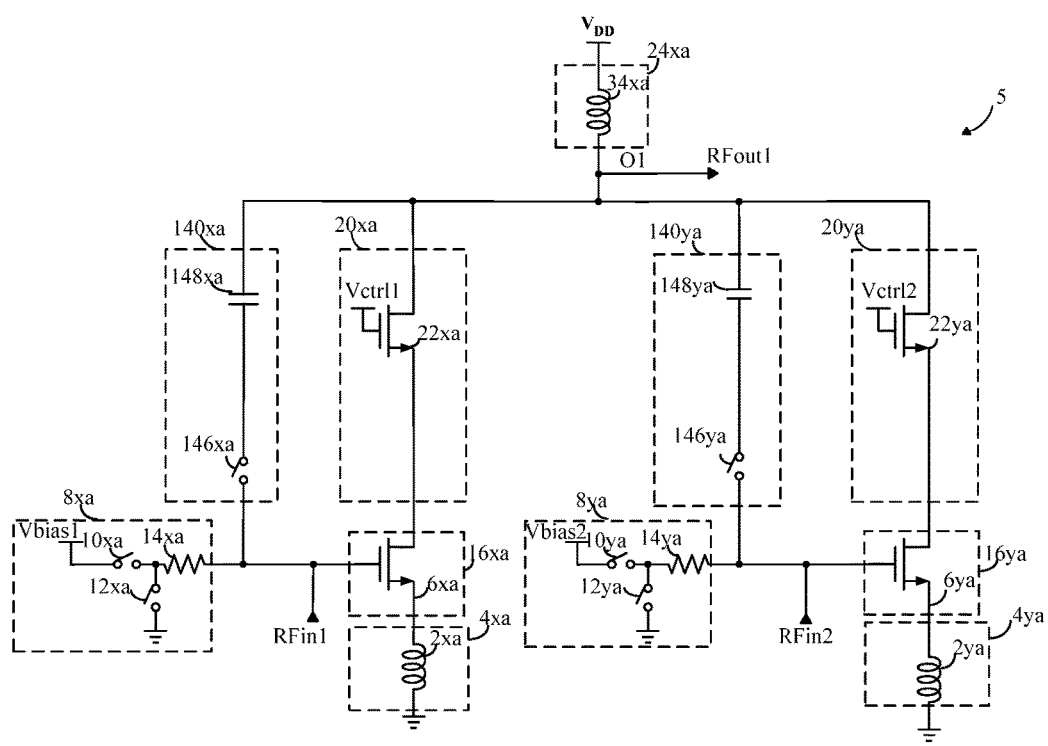
FIG. 3 is a schematic circuit diagram of a low noise amplifier according to an embodiment of the present disclosure.

FIG. 3 is a schematic circuit diagram of a low noise amplifier according to an embodiment of the present disclosure. As shown in FIG. 3, a first low noise amplifier 5 is composed of a bypass circuit 140xa, a bypass circuit 140ya, an amplification selection switching circuit 8xa, an amplification selection switching circuit 8ya, a gain stage circuit 16xa, a gain stage circuit 16ya, a driving circuit 20xa, a driving circuit 20ya, a load circuit 24xa, a coupling circuit 4xa and a coupling circuit 4ya. The first low noise amplifier 5 is capable of amplifying and/or directly transmitting two RF input signals $RF_{in1}$ and $RF_{in2}$ and then outputting them.

Specifically, the coupling circuit 4xa includes a coupling inductor 2xa used for source electrode negative feedback; the coupling circuit 4ya includes a coupling inductor 2ya for source electrode negative feedback; the gain stage circuit 16xa includes a gain transistor 6xa; and the gain stage circuit 16ya includes a gain transistor 6ya. The gain transistor 6xa and the gain transistor 6ya may employ various types of transistors. For example, in this embodiment, both of the gain transistor 6xa and the gain transistor 6ya employ the NMOS transistor. A source electrode of the gain transistor 6xa is connected to one terminal of the coupling inductor 2xa, and the other terminal of the coupling inductor 2xa is grounded. A source electrode of the gain transistor 6ya is connected to one terminal of the coupling inductor 2ya, and the other terminal of the coupling inductor 2ya is grounded. In one or more embodiments, the source electrode of the gain transistor 6xa and the source electrode of the gain transistor 6ya may be directly grounded, or may be grounded through the coupling inductor 2xa.

The driving circuit 20xa includes a driving transistor 22xa, and the driving circuit 20ya includes a driving transistor 22ya. The driving transistor 22xa and the driving transistor 22ya may employ various types of transistors. For example, in this embodiment, both of the driving transistor 22xa and the driving transistor 22ya employ the NMOS transistors. A gate electrode of the driving transistor 22xa is connected to a control voltage Vctrl1, and a gate electrode of the driving transistor 22ya is connected to a control voltage Vctrl2. A source electrode of the driving transistor 22xa is connected to a drain electrode of the gain transistor 6xa, and a source electrode of the driving transistor 22ya is connected to a drain electrode of the gain transistor 6ya. The magnitudes of the control voltage Vctrl1 and the control voltage Vctrl2 are generated by the control signal generation circuit, and may be adaptively configured according to specific circuits.

The load circuit 24xa includes a load inductor 34xa. One terminal of the load inductor 34xa is connected to a power source voltage VDD. The other terminal of the load inductor 34xa is connected to a drain electrode of the driving transistor 22xa, a drain electrode of the driving transistor 22ya, a bypass coupling capacitor 148xa of the bypass circuit 140xa and a bypass coupling capacitor 148ya of the bypass circuit 140ya, to form the RF signal output terminal. Moreover, the load circuit 24xa may further include one or more of a load capacitor, a load resistor and a balun transistor to provide an active load. The frequency response of the output signal of the load circuit 24xa may be narrowband or wideband.

The amplification selection switching circuit 8xa includes a power source switch 10xa, a grounding switch 12xa and a selection resistor 14xa. The amplification selection switching circuit 8ya includes a power source switch 10ya, a grounding switch 12ya and a selection resistor 14ya. One terminal of the power source switch 10xa is connected to a bias voltage Vbias1, and the other terminal of the power source switch 10xa is connected to one terminal of the selection resistor 14xa and the grounding switch 12xa. The other terminal of the grounding switch 12xa is grounded. The other terminal of the selection resistor 14xa is connected to the gate electrode of the gain transistor 6xa and one terminal of a bypass switch 146xa of the bypass circuit 140xa. The other terminal of the bypass switch 146xa is connected to one terminal of the bypass coupling capacitor 148xa. The other terminal of the bypass coupling capacitor 148xa is connected to the RF output terminal. One terminal of the power source switch 10ya is connected to a bias voltage Vbias2, and the other terminal of the power source switch 10ya is connected to one terminal of the selection resistor 14ya and the grounding switch 12ya. The other terminal of the grounding switch 12ya is grounded. The other terminal of the selection resistor 14ya is connected to the gate electrode of the gain transistor 6ya and one terminal of a bypass switch 146ya of the bypass circuit 140ya. The other terminal of the bypass switch 146ya is connected to one terminal of the bypass coupling capacitor 148ya. The other terminal of the bypass coupling capacitor 148ya is connected to the RF output terminal. The open/close states of the power source switch 10xa, the power source switch 10ya, the grounding switch 12xa, the grounding switch 12ya, the bypass coupling switch 146xa and the bypass coupling switch 146ya are controlled by the control signal generation circuit. The frequencies or frequency bands of the RF signal $RF_{in1}$ to be amplified and the RF signal $RF_{in2}$ to be amplified may be the same or different.

It can be seen that the low noise amplifier includes two RF input terminals and one RF output terminal.

In one exemplarily design, the gain stage circuit 16xa and the gain stage circuit 16ya may be individually enabled (that is, turned on) or individually disabled (that is, turned off). Specifically, (i) the power source switch 10xa is closed (i.e., turned on), the grounding switch 12xa and the bypass switch 146xa are opened (i.e., turned off), such that the bias voltage Vbias1 is applied to the gate electrode of the gain transistor 6xa, enabling the gain transistor 6xa to be turned on, or (ii) the power source switch 10xa is opened and the grounding switch 12xa is closed, enabling the gate electrode of the gain transistor 6xa to be grounded through the selection resistor 14xa, such that the gain transistor 6xa is turned off. The process of enabling and disabling the gain transistor 6ya is similar as that of the gain transistor 6xa, and is not described here again.

In one exemplarily design, the bypass circuit 140xa and the bypass circuit 140ya may be individually enabled (that is, turned on) or individually disabled (that is, turned off). Specifically, (i) the bypass switch 146xa is closed, the grounding switch 12xa is closed and the power source switch 10xa is opened, such that the gain transistor 6xa is turned off, the bypass circuit 140xa is enabled, and hence the RF input signal $RF_{in1}$ is transmitted to an output terminal O1 through the bypass coupling capacitor 148xa. (ii), the bypass switch 146xa is turned off, and accordingly the bypass circuit 140xa is disabled. The process of enabling and disabling the bypass circuit 140ya is similar as that of the bypass circuit 140xa, and is not described here again.

The first low noise amplifier 5 may include a first operation mode, a second operation mode and a third operation mode. In the first operation mode, the bypass circuits are disabled, and one or more of the plurality of the gain stage circuits are enabled to obtain one or more amplified RF signals.

In the second operation mode, the gain stage circuits are disabled, and one or more of the plurality of bypass circuits are enabled to obtain one or more RF transmission signals for mitigating the distortion caused by the excessive amplitude of the RF signal.

In the third operation mode, one or more of the plurality of gain stage circuits and one or more of the plurality of bypass circuits are enabled to obtain one or more amplified RF signals and one or more RF transmission signals.

Figure 4A:
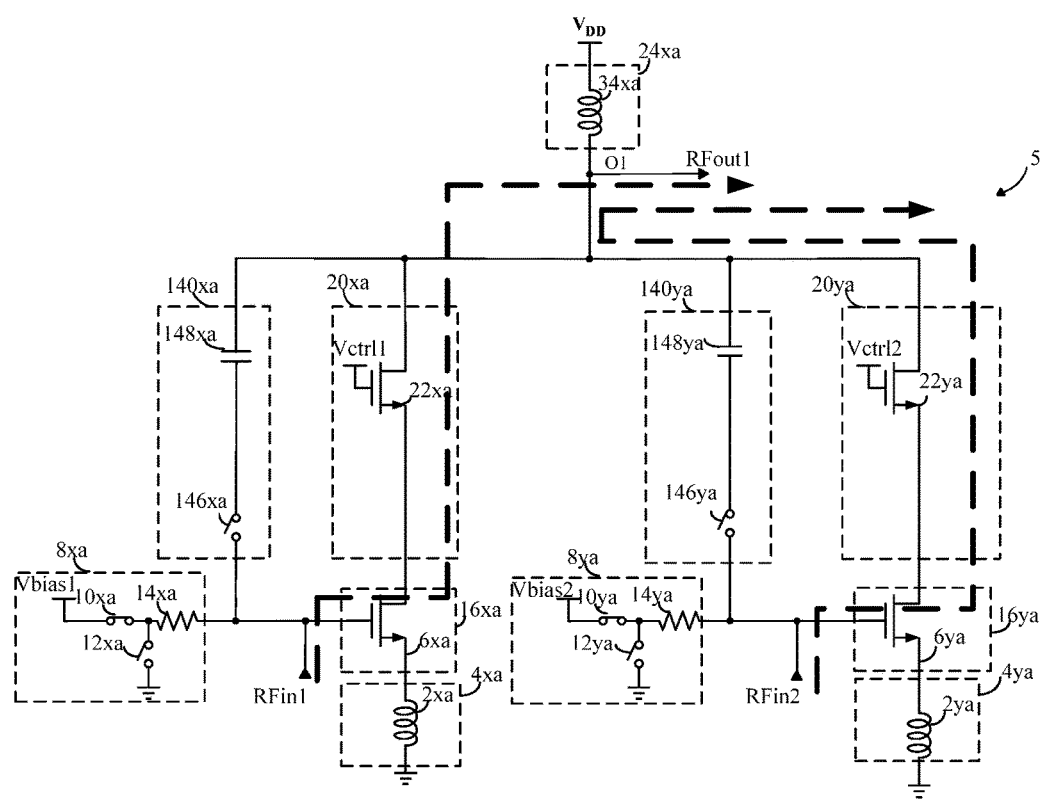
FIG. 4A is a diagram showing an operation example of a first operation mode of the low noise amplifier shown in FIG. 3.

FIG. 4A is a diagram showing an operation example of a first operation mode of the low noise amplifier shown in FIG. 3. As shown in FIG. 4A, in a specific implementation, the grounding switch 12xa is opened, the bypass switch 146xa is opened, the power source switch 10xa is closed, so that the bias voltage Vbias1 is applied to the gate electrode of gain transistor 6xa through the selection resistor 14xa, the gain transistor 6xa is turned on to amplify the inputted RF signal $RF_{in1}$, the control voltage Vctrl1 enables the driving transistor 22xa to be turned on, and hence the amplified RF signal is transmitted to the load circuit 24xa through the driving transistor 22xa, and operates with the load inductor 34xa to generate the output RF signal and output the output RF signal from the RF signal output terminal OA1.

Further, the grounding switch 12ya is opened, the bypass switch 146ya is opened and the power source switch 10ya is closed, so that the bias voltage Vbias2 is applied to the gate electrode of the gain transistor 6ya through the selection resistor 14ya, the gain transistor 6ya is turned on to amplify the inputted RF signal $RF_{in2}$, the control voltage Vctrl2 enables the driving transistor 22ya to be turned on, and hence the amplified RF signal is transmitted to the load circuit 24xa through the driving transistor 22ya, and operate with the load inductor 34xa to generate the output RF signal $RF_{out1}$ and output the output RF signal from the RF signal output terminal O1.

The broken line in FIG. 4A may indicate the transmission paths of the RF signals.

FIG. 4A is merely a non-exclusive operation example of the first operation mode of the first low noise amplifier 5. Specifically, in the first operation mode of the first low noise amplifier 5, all the bypass circuits are controlled to be turned off through the control signal generation circuit, and the amplification switch selection circuits and the driving circuits are controlled to be turned on/off correspondingly, such that one or more RF input signals are amplified through the gain stage circuits and are transmitted to the load circuits through the driving circuit, and then the RF input signals operate with the load circuits to generate and output one or more RF output signals.

Figure 4B:
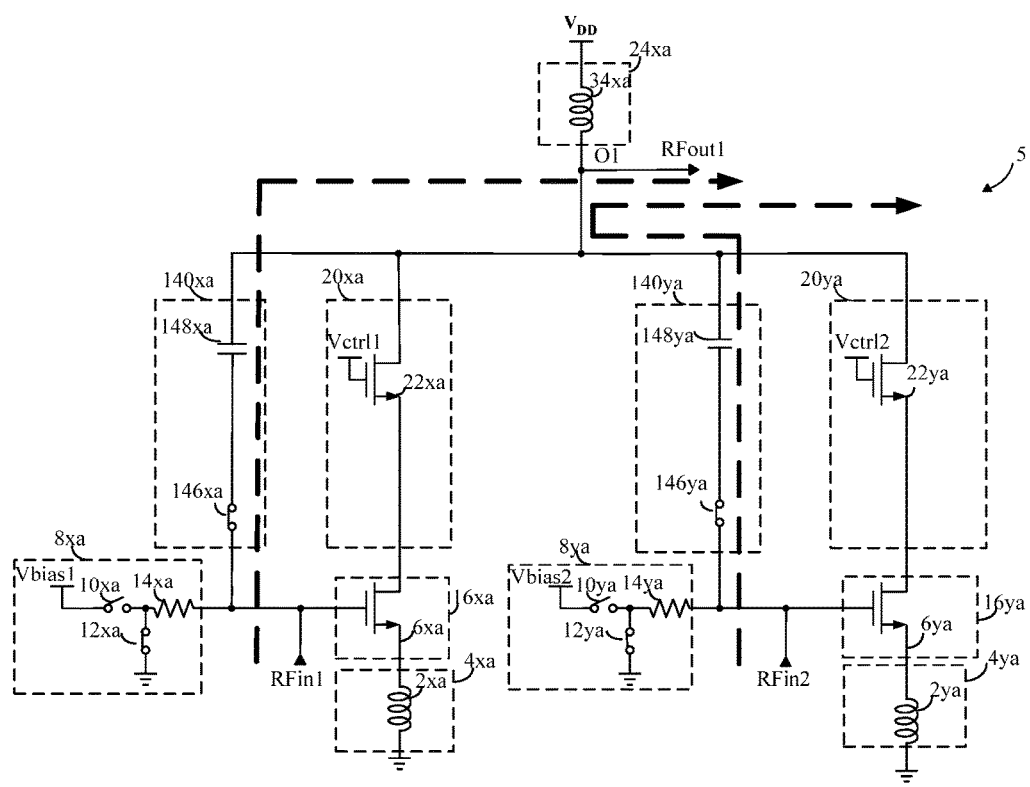
FIG. 4B is a diagram showing an operation example of a second operation mode of the low noise amplifier shown in FIG. 3.

FIG. 4B is a diagram showing an operation example of a second operation mode of the low noise amplifier shown in FIG. 3. As shown in FIG. 4B, in a specific implementation, the grounding switch 12xa is closed, the bypass switch 146xa is closed, the power source switch 10xa is opened, such that the gate electrode of the gain transistor 6xa is grounded through the selection resistor 14xa, the gain transistor 6xa is opened, and then the RF input signal $RF_{in1}$ is transmitted to the load circuit 24xa through the bypass coupling capacitor 148xa and operates with the load inductor 34xa to generate the output RF signal and output the output RF signal from the RF signal output terminal O1.

Further, the grounding switch 12ya is closed, the bypass switch 146ya is closed, the power source switch 10ya is opened, the gate electrode of the gain transistor 6ya is grounded through the selection resistor 14ya, the gain transistor 6ya is turned off, and then the RF input signal $RF_{in2}$ is transmitted to the load circuit 24xa through the bypass coupling capacitor 148ya and operates with the load inductor 34xa to generate the output RF signal and output the output RF signal from the RF signal output terminal.

The dashed line in FIG. 4B may represent the transmission paths of the RF signals. FIG. 4B is merely a non-exclusive operation example of the second operation mode of the first low noise amplifier 5. Specifically, in the second operation mode of the first low noise amplifier 5, the amplification selection switching circuits are controlled by the control signal generation circuit, such that all the gain transistors of the plurality of gain stage circuits are turned off; and the bypass switches of the bypass circuits are controlled to be turned on/off, and hence one or more RF input signals are transmitted to the load circuits through the bypass coupling capacitors and operate with the load circuits to generate one or more RF output signals.

Figure 4C:
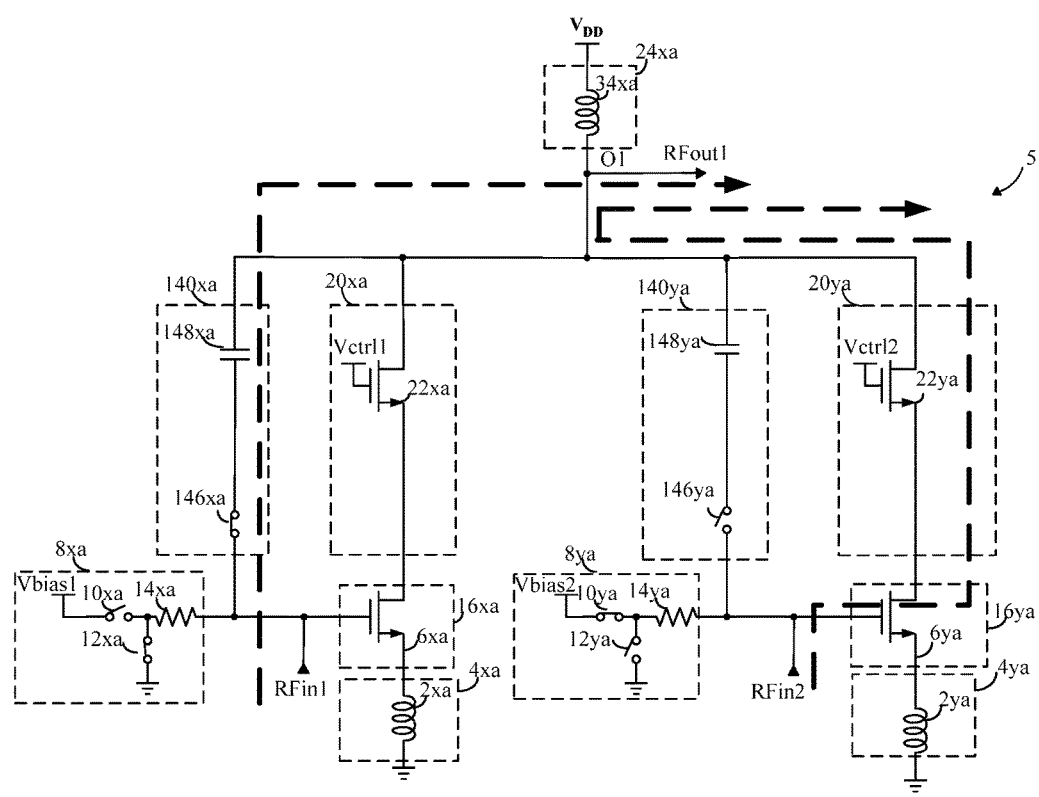
FIG. 4C is a diagram showing an operation example of a third operation mode of the low noise amplifier shown in FIG. 3.

FIG. 4C is a diagram showing an operation example of a third operation mode of the low noise amplifier shown in FIG. 3. As shown in FIG. 4C, in a specific implementation, the grounding switch 12xa is closed, the bypass switch 146xa is closed, the power source switch 10xa is opened, the gate electrode of the gain transistor 6xa is grounded through the selection resistor 14xa, the gain transistor 6xa is turned off, the RF input signal $RF_{in1}$ is transmitted to the load circuit 24xa through the bypass coupling capacitor 148xa and operates with the load inductor 34xa to generate the output RF signal and output the output RF signal from the RF signal output terminal.

Further, the grounding switch 12ya is opened, the bypass switch 146ya is opened, the power source switch 10ya is closed, and therefore the bias voltage Vbias2 is applied to the gate electrode of the gain transistor 6ya through the selection resistor 14ya, the gain transistor 6ya is turned on to amplify the inputted RF signal $RF_{in2}$, the control voltage Vctrl2 enables the driving transistor 22ya to be turned on, such that the amplified RF signal is transmitted to the load circuit 24xa through the driving transistor 22ya and operates with the load inductor 34xa to generate the output RF signal and output the output RF signal from the RF signal output terminal.

FIG. 4C is merely a non-exclusive operation example of the third operation mode of the first low noise amplifier 5. Specifically, the third operation mode of the first low noise amplifier 5 further includes: the amplification selection switching circuits are controlled by the control signal generation circuit, such that one or more gain transistors of the plurality of gain stage circuits are turned on; and the driving transistors and the bypass switches of the bypass circuits are controlled to be turned on/off, such that one or more RF input signals are transmitted to the load circuit through the bypass coupling capacitors, and at this time, another one or more RF input signals are also transmitted to the load circuit through the gain stage circuits and the driving circuits, these signals operate together with the load circuit to generate multiple RF output signals.

Figure 5A:
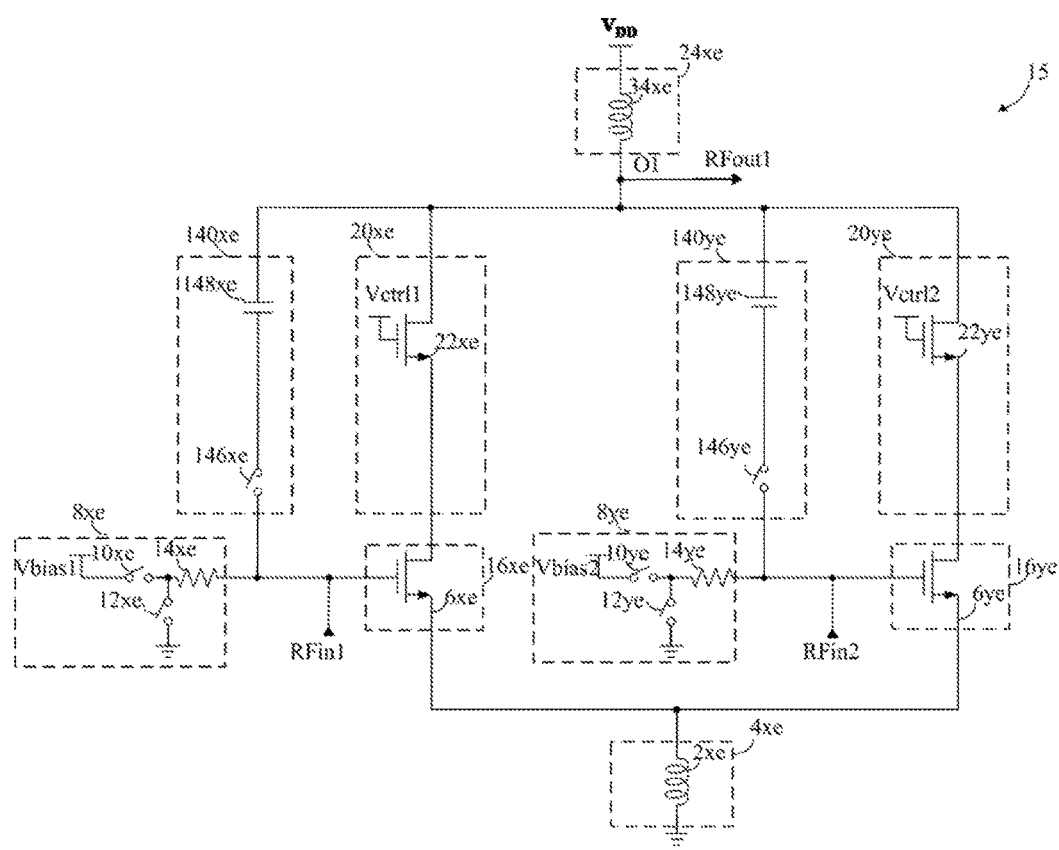
FIG. 5A is a schematic circuit diagram of another low noise amplifier according to an embodiment of the present disclosure.

FIG. 5A is a schematic circuit diagram of another low noise amplifier according to an embodiment of the present disclosure. As shown in FIG. 5A, a second low noise amplifier 15 includes a bypass circuit 140xe, a bypass circuit 140ye, a amplification selection switching circuit 8xe, an amplification selection switching circuit 8ye, a gain stage circuit 16xe, a gain stage circuit 16ye, a driving circuit 20xe, a driving circuit 20ye, a load circuit 24xe and a coupling circuit 4xe. The second low noise amplifier 15 is capable of amplifying and/or directly transmitting two input RF signals $RF_{in1}$ and $RF_{in2}$ and then outputting them.

Specifically, the coupling circuit 4xe includes a coupling inductor 2xe for source electrode negative feedback. The gain stage circuit 16xe includes a gain transistor 6xe. The gain stage circuit 16ye includes a gain transistor 6ye. The gain transistors may employ various types of transistors. For example, in this embodiment, both of the gain transistor 6xe and the gain transistor 6ye employ the NMOS transistor. A source electrodes of the gain transistor 6xe and the gain transistor 6ye is connected to one terminal of the coupling inductor 2xe, and the other terminal of the coupling inductor 2xe is grounded. A source electrode of the gain transistor 6xe is mutually connected to a source electrode of the gain transistor 6ye and one terminal of the coupling inductor 2xe, and the other terminal of the coupling inductor 2xe is grounded. In one or more embodiments, the source electrodes of the gain transistor 6xe and the gain transistor 6ye may be directly grounded.

The driving circuit 20xe includes a driving transistor 22xe, and the driving circuit 20ye includes a driving transistor 22ye. The driving transistor 22xe and the driving transistor 22ye may employ various types of transistors. For example, in this embodiment, both of the driving transistor 22xe and the driving transistor 22ye employ the NMOS transistors. A gate electrode of the driving transistor 22xe is connected to a control voltage Vctrl1, and a gate electrode of the driving transistor 22ye is connected to a control voltage Vctrl2. A source electrode of the driving transistor 22xe is connected to a drain electrode of the gain transistor 6xe, and a source electrode of the driving transistor 22ye is connected to a drain electrode of the gain transistor 6ye. The magnitudes of the control voltage Vctrl1 and the control voltage Vctrl2 are generated by the control signal generation circuit, and may be correspondingly configured according to specific circuits.

The load circuit 24xe includes a load inductor 34xe. One terminal of the load inductor 34xe is connected to a power source voltage VDD. The other terminal of the load inductor 34xe, a drain electrode of the driving transistor 22xe, a drain electrode of the driving transistor 22ye, a bypass coupling capacitor 148xe of the bypass circuit 140xe and a bypass coupling capacitor 148ye of the bypass circuit 140ye are connected to each other to form the RF signal output terminal. Moreover, the load circuit 24xe may further include one or more of a load capacitor, a load resistor and a balun transistor to provide an active load. The frequency response of the load circuit 24xe may be narrowband or wideband.

The amplification selection switching circuit 8xe includes a power source switch 10xe, a grounding switch 12xe and a selection resistor 14xe. The amplification selection switching circuit 8ye includes a power source switch 10ye, a grounding switch 12ye and a selection resistor 14ye. One terminal of the power source switch 10xe is connected to a bias voltage Vbias1, and the other terminal of the power source switch 10xe is connected to one terminal of the selection resistor 14xe and the grounding switch 12xe. The other terminal of the grounding switch 12xe is grounded. The other terminal of the selection resistor 14xe is connected to the gate electrode of the gain transistor 6xe and one terminal of a bypass switch 146xe of the bypass circuit 140xe. The other terminal of the bypass switch 146xe is connected to one terminal of the bypass coupling capacitor 148xe. The other terminal of the bypass coupling capacitor 148xe is connected to the RF output terminal. One terminal of the power source switch 10ye is connected to a bias voltage Vbias2, and the other terminal of the power source switch 10ye is connected to one terminal of the selection resistor 14ye and the grounding switch 12ye. The other terminal of the grounding switch 12ye is grounded. The other terminal of the selection resistor 14ye is connected to the gate electrode of the gain transistor 6ye and one terminal of a bypass switch 146ye of the bypass circuit 140ye. The other terminal of the bypass switch 146ye is connected to one terminal of the bypass coupling capacitor 148ye. The other terminal of the bypass coupling capacitor 148ye is connected to the RF output terminal. The open/close states of the power source switch 10xe, the power source switch 10ye, the grounding switch 12xe, the grounding switch 12ye, the bypass coupling switch 146xe and the bypass coupling switch 146ye are controlled by the control signal generation circuit. The frequencies or frequency bands of the RF signal $RF_{in1}$ to be amplified and the RF signal $RF_{in2}$ to be amplified may be the same or different.

Functions of the bypass circuit 140xe, the bypass circuit 140ye, the amplification selection switching circuit 8xe, the amplification selection switching circuit 8ye, the gain stage circuit 16xe, the gain stage circuit 16ye, the driving circuit 20xe, the driving circuit 20ye, the load circuit 24xe, the coupling circuit 4xe and a coupling circuit of the second low noise amplifier 15 in FIG. 5A are same with the functions of the bypass circuit 140xa, the bypass circuit 140ya, the amplification selection switching circuit 8xa, the amplification selection switching circuit 8ya, the gain stage circuit 16xa, the gain stage circuit 16ya, the driving circuit 20xa, the driving circuit 20ya, the load circuit 24xa, and the coupling circuit 4xa and the coupling circuit 4ya of the first low noise amplifier 5 in FIG. 3, respectively. The difference merely lies in that, in the second low noise amplifier 15 in FIG. 5A, the source electrode of the gain transistor 6xe is connected to the source electrode of the gain transistor 6ye and one terminal of the coupling inductor 2xe, and the other terminal of the coupling inductor 2xe is grounded. That is, the gain stage circuit 16xe and the gain stage circuit 16ye may share one coupling circuit 4xe to form the negative feedback circuit for the gain stage circuit. On the basis of reducing the nonlinear distortion of the circuit, the number of coupling circuits 4xe is also saved, thereby saving the circuit area.

In the first low noise amplifier 5 in FIG. 3, the source electrode of the gain transistor 6xa is connected to one terminal of the coupling inductor 2xa, and the other terminal of the coupling inductor 2xa is grounded; the source electrode of the gain transistor 6ye is connected to one terminal of the coupling inductor 2ya, and the other terminal of the coupling inductor 2ya is grounded.

The operation modes of the second low noise amplifier 15 are the same as the operation modes of the first low noise amplifier 5, and the specific operation process is not described herein again.

Figure 5B:
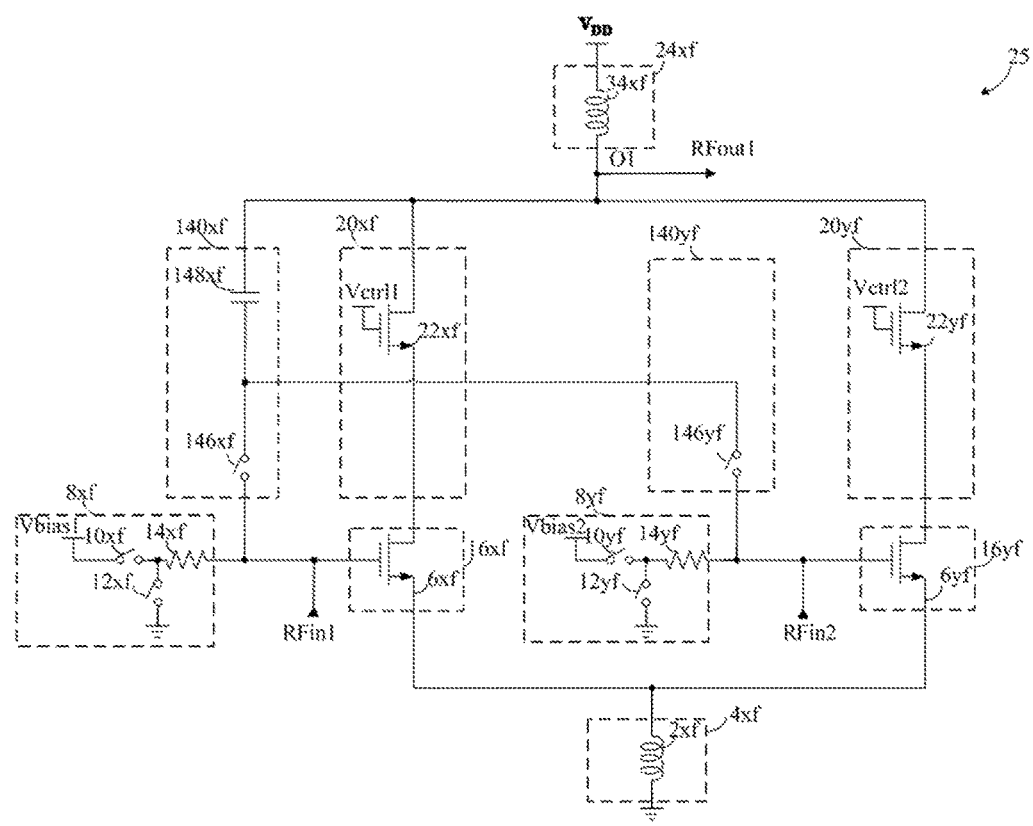
FIG. 5B is a schematic circuit diagram of another low noise amplifier according to an embodiment of the present disclosure.

FIG. 5B is a schematic circuit diagram of another low noise amplifier according to an embodiment of the present disclosure. As shown in FIG. 5B, a third low noise amplifier 25 includes a bypass circuit 140xf, a bypass circuit 140yf, an amplification selection switching circuit 8xf, an amplification selection switching circuit 8yf, a gain stage circuit 16xf, a gain stage circuit 16yf, a driving circuit 20xf, a driving circuit 20yf, a load circuit 24xf and a coupling circuit 4xf The third low noise amplifier 25 is capable of amplifying and/or directly transmitting two input RF signals $RF_{in1}$ and $RF_{in2}$ and then outputting them.

Specifically, the coupling circuit 4xf includes a coupling inductor 2xf used for source electrode negative feedback; the gain stage circuit 16xf includes a gain transistor 6xf; and the gain stage circuit 16yf includes a gain transistor 6yf. The gain transistor 6xf and the gain transistor 6yf may employ various types of transistors. For example, in this embodiment, both of the gain transistor 6xf and the gain transistor 6yf employ the NMOS transistor. A source electrode of the gain transistor 6xf is connected to one terminal of the coupling inductor 2xf, and the other terminal of the coupling inductor 2xf is grounded. A source electrode of the gain transistor 6xf, a source electrode of the gain transistor 6yf and one terminal of the coupling inductor 2xf are mutually connected, and the other terminal of the coupling inductor 2xf is grounded. In another embodiment, the source electrode of the gain transistor 6xf and the source electrode of the gain transistor 6yf may be directly grounded.

The driving circuit 20xf includes a driving transistor 22xf, and the driving circuit 20yf includes a driving transistor 22yf. The driving transistor 22xf and the driving transistor 22yf may employ various types of transistors. In this embodiment, both of the driving transistor 22xf and the driving transistor 22yf employ NMOS transistors. A gate electrode of the driving transistor 22xf is connected to a control voltage Vctrl1, and a gate electrode of the driving transistor 22yf is connected to a control voltage Vctrl2. A source electrode of the driving transistor 22xf is connected to a drain electrode of the gain transistor 6xf, and a source electrode of the driving transistor 22yf is connected to a drain electrode of the gain transistor 6yf. The magnitudes of the control voltage Vctrl1 and the control voltage Vctrl2 are generated by the control signal generation circuit, and may be correspondingly configured according to specific circuits.

The load circuit 24xf includes a load inductor 34xf. One terminal of the load inductor 34xf is connected to a power source voltage VDD. The other terminal of the load inductor 34xf, a drain electrode of the driving transistor 22xf, a drain electrode of the driving transistor 22yf, and a bypass coupling capacitor 148xf of the bypass circuit 140xf are connected to each other to form a RF signal output terminal O1. Moreover, the load circuit 24xf may further include one or more of a load capacitor, a load resistor and a balun transistor to provide an active load. The frequency response of the output signal of the load circuit 24xf may be narrowband or wideband.

The amplification selection switching circuit 8xf includes a power source switch 10xf, a grounding switch 12xf and a selection resistor 14xf. The amplification selection switching circuit 8yf includes a power source switch 10yf, a grounding switch 12yf and a selection resistor 14yf. One terminal of the power source switch 10xf is connected to a bias voltage Vbias1, and the other terminal of the power source switch 10xf is connected to one terminal of the selection resistor 14xf and the grounding switch 12xf. The other terminal of the grounding switch 12xf is grounded. The other terminal of the selection resistor 14xf is connected to the gate electrode of the gain transistor 6xf and one terminal of a bypass switch 146xf of the bypass circuit 140xf. The other terminal of the bypass switch 146xf is connected to one terminal of the bypass coupling capacitor 148xf. The other terminal of the bypass coupling capacitor 148xf is connected to the RF output terminal. One terminal of the power source switch 10yf is connected to a bias voltage Vbias2, and the other terminal of the power source switch 10yf is connected to one terminal of the selection resistor 14yf and the grounding switch 12yf. The other terminal of the grounding switch 12yf is grounded. The other terminal of the selection resistor 14yf is connected to the gate electrode of the gain transistor 6yf and one terminal of a bypass switch 146yf of the bypass circuit 140yf. The other terminal of the bypass switch 146yf is connected to one terminal of the bypass coupling capacitor 148xf. The other terminal of the bypass coupling capacitor 148xf is connected to the RF output terminal. The open/close states of the power source switch 10xf, the power source switch 10yf, the grounding switch 12xf, the grounding switch 12yf, the bypass switch 146xf and the bypass switch 146yf are controlled by the control signal generation circuit. The frequencies or frequency bands of the RF signal $RF_{in1}$ to be amplified and the RF signal $R_{Fin2}$ to be amplified may be the same or different.

Functions of the bypass circuit 140xf, the bypass circuit 140yf, the amplification selection switching circuit 8xf, the amplification selection switching circuit 8yf, the gain stage circuit 16xf, the gain stage circuit 16yf, the driving circuit 20xf, the driving circuit 20yf, the load circuit 24xf, the coupling circuit 4xf and the coupling circuit of the third low noise amplifier 25 in FIG. 5B are respectively in accordance with the corresponding descriptions of the functions of the bypass circuit 140xe, the bypass circuit 140ye, the amplification selection switching circuit 8xe, the amplification selection switching circuit 8ye, the gain stage circuit 16xe, the gain stage circuit 16ye, the driving circuit 20xe, the driving circuit 20ye, the load circuit 24xe, the coupling circuit 4xe and the coupling circuit of the second low noise amplifier 15 in FIG. 5A. The difference merely lies in that, in the third low noise amplifier 25 in FIG. 5B, the bypass switch 146yf and the bypass switch 146xf share the bypass coupling capacitor 148xf.

In the second low noise amplifier 15 in FIG. 5A, the bypass circuit 140yf and the bypass coupling capacitor 148yf are connected to each other, and the bypass circuit 140xf and the bypass coupling capacitor 148xf are connected to each other.

The operation modes of the third low noise amplifier 25 are the same as the operation modes of the second low noise amplifier 15, and the specific operation process is not repeated here.

Figure 5C:
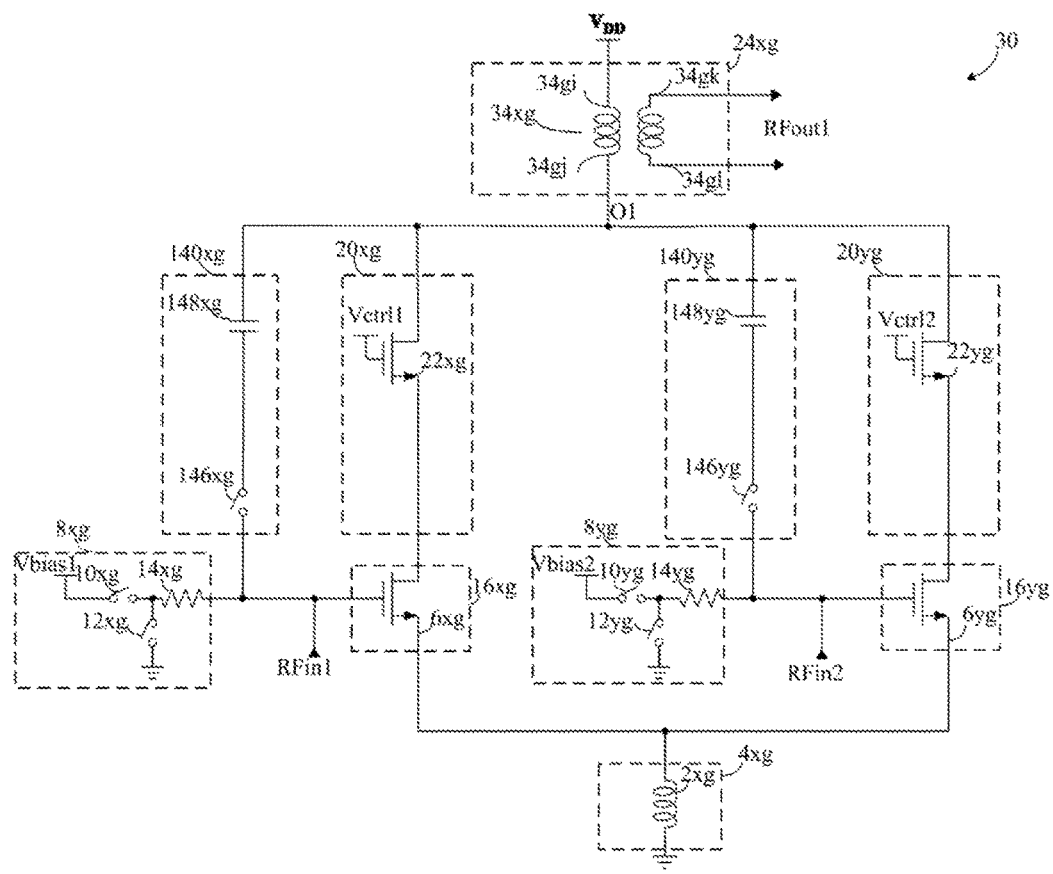
FIG. 5C is a schematic circuit diagram of another low noise amplifier according to an embodiment of the present disclosure.

FIG. 5C is a schematic circuit diagram of another low noise amplifier according to an embodiment of the present disclosure. As shown in FIG. 5C, a fourth low noise amplifier 30 includes a bypass circuit 140xg, a bypass circuit 140yg, an amplification selection switching circuit 8xg, an amplification selection switching circuit 8yg, a gain stage circuit 16xg, a gain stage circuit 16yg, a driving circuit 20xg, a driving circuit 20yg, a load circuit 24xg and a coupling circuit 4xg. The fourth low noise amplifier 30 is capable of amplifying and/or directly transmitting two input RF signals $RF_{in1}$ and $RF_{in2}$ and then outputting them.

Specifically, the coupling circuit 4xg includes a coupling inductor 2xg used for source electrode negative feedback. The gain stage circuit 16xg includes a gain transistor 6xg; and the gain stage circuit 16yg includes a gain transistor 6yg. The gain transistors may employ various types of transistors. For example, in this embodiment, both of the gain transistor 6xg and the gain transistor 6yg employ the NMOS transistors. A source electrode of the gain transistor 6xg, a source electrode of the gain transistor 6yg and one terminal of the coupling inductor 2xg are connected to each other, and the other terminal of the coupling inductor 2xg is grounded. In one or more embodiments, the source electrode of the gain transistor 6xg and the source electrode of the gain transistor 6yg may be directly grounded.

The driving circuit 20xg includes a driving transistor 22xg, and the driving circuit 20yg includes a driving transistor 22yg. Both of the driving transistor 22xg and the driving transistor 22yg may employ various types of transistors. For example, in this embodiment, both of the driving transistor 22xg and the driving transistor 22yg employ NMOS transistors. A gate electrode of the driving transistor 22xg is connected to a control voltage Vctrl1, and a gate electrode of the driving transistor 22yg is connected to a control voltage Vctrl2. A source electrode of the driving transistor 22xg is connected to a drain electrode of the gain transistor 6xg, and a source electrode of the driving transistor 22yg is connected to a drain electrode of the gain transistor 6yg. The magnitudes of the control voltage Vctrl1 and the control voltage Vctrl2 are generated by the control signal generation circuit, and may be correspondingly configured according to specific circuits.

The load circuit 24xg includes a balun 34xg. An unbalanced terminal 34gi of the balun 34xg is connected to a power source voltage VDD, and another unbalanced terminal 34gj of the balun 34xg, a drain electrode of the driving transistor 22xg, a drain electrode of the driving transistor 22yg, a bypass coupling capacitor 148xg of the bypass circuit 140xg and a bypass coupling capacitor 148yg of the bypass circuit 140yg are connected to each other. A balanced terminal 34gk and another balanced terminal 34gl of the balun form the RF signal output terminal of the low noise amplifier. In addition, the load circuit 24xg may further include one or more of a load capacitor, a load resistor and a balun transistor to provide an active load. The frequency response of the load circuit 24xg may be narrowband or wideband.

The amplification selection switching circuit 8xg includes a power source switch 10xg, a grounding switch 12xg and a selection resistor 14xg. The amplification selection switching circuit 8yg includes a power source switch 10yg, a grounding switch 12yg and a selection resistor 14yg. One terminal of the power source switch 10xg is connected to a bias voltage Vbias1, and the other terminal of the power source switch 10xg is connected to one terminal of the selection resistor 14xg and the grounding switch 12xg. The other terminal of the grounding switch 12xg is grounded. The other terminal of the selection resistor 14xg is connected to the gate electrode of the gain transistor 6xg and one terminal of a bypass switch 146xg of the bypass circuit 140xg. The other terminal of the bypass switch 146xg is connected to one terminal of the bypass coupling capacitor 148*xg*. The other terminal of the bypass coupling capacitor 148*xg* is connected to a RF output terminal O1. One terminal of the power source switch 10*yg* is connected to a bias voltage Vbias2, and the other terminal of the power source switch 10*yg* is connected to one terminal of the selection resistor 14*yg* and the grounding switch 12*yg*. The other terminal of the grounding switch 12*yg* is grounded. The other terminal of the selection resistor 14*yg* is connected to the gate electrode of the gain transistor 6*yg* and one terminal of a bypass switch 146*yg* of the bypass circuit 140*yg*. The other terminal of the bypass switch 146*yg* is connected to one terminal of the bypass coupling capacitor 148*xg*. The other terminal of the bypass coupling capacitor 148*xg* is connected to the RF output terminal O1. The open/close states of the power source switch 10*xg*, the power source switch 10*yg*, the grounding switch 12*xg*, the grounding switch 12*yg*, the bypass switch 146*xg* and the bypass switch 146*yg* are controlled by the control signal generation circuit. The frequencies or frequency bands of the RF signal RFin1 to be amplified and the RF signal RFin2 to be amplified may be the same or different.

Functions of the bypass circuit 140*xg*, the bypass circuit 140*yg*, the amplification selection switching circuit 8*xg*, the amplification selection switching circuit 8*yg*, the gain stage circuit 16*xg*, the gain stage circuit 16*yg*, the driving circuit 20*xg*, the driving circuit 20*yg*, the load circuit 24*xg*, the coupling circuit 4*xg* and the coupling circuit of the fourth low noise amplifier 30 in FIG. 5C are same with the corresponding descriptions of the functions of the bypass circuit 140*xe*, the bypass circuit 140*ye*, the amplification selection switching circuit 8*xe*, the amplification selection switching circuit 8*ye*, the gain stage circuit 16*xe*, the gain stage circuit 16*ye*, the driving circuit 20*xe*, the driving circuit 20*ye*, the load circuit 24*xe*, the coupling circuit 4*xe* and the coupling circuit of the second low noise amplifier 15 in FIG. 5A, respectively. The difference merely lies in that, the load circuit of the fourth low noise amplifier 30 in FIG. 5C is a balun, and the load circuit of the second low noise amplifier 15 in FIG. 5A is a load inductor. The operation modes of the fourth low noise amplifier 30 are the same as the operation modes of the second low noise amplifier 15, and the specific operation process is not described again.

Figure 6A:
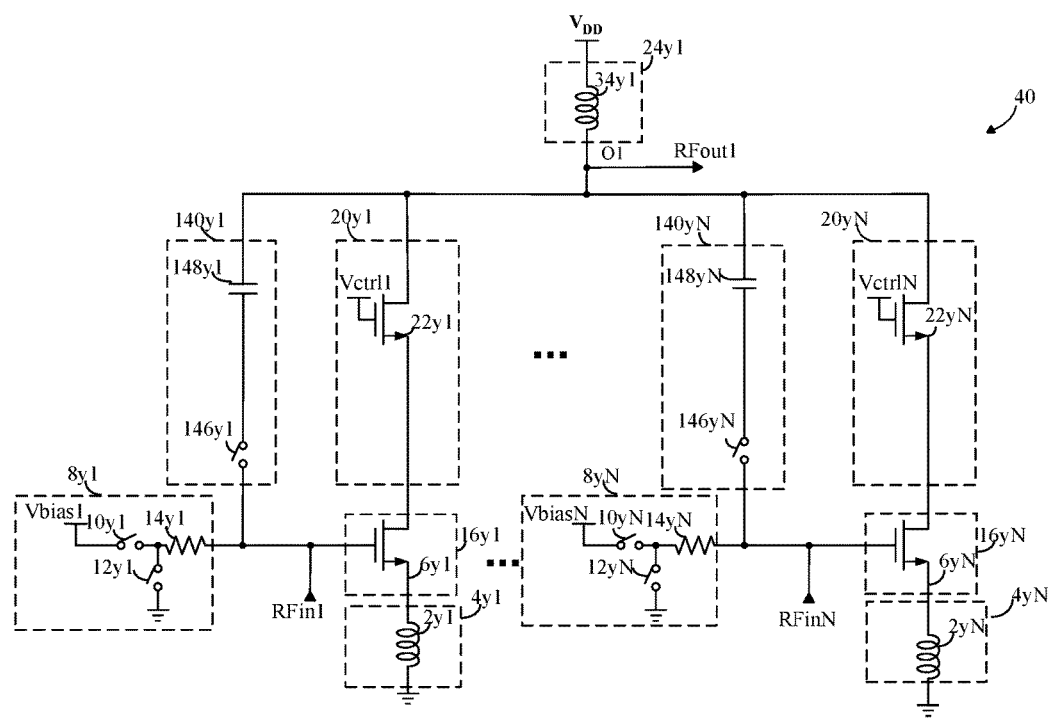
FIG. 6A is a schematic circuit diagram of another low noise amplifier according to an embodiment of the present disclosure.

FIG. 6A is a schematic circuit diagram of another low noise amplifier according to an embodiment of the present disclosure. As shown in FIG. 6A, a fifth low noise amplifier 40 includes N bypass circuits including a bypass circuit 140*y*1 to a bypass circuit 140*y*N; N amplification selection switching circuits including an amplification selection switching circuit 8*y*1 to an amplification selection switching circuit 8*y*N; N gain stage circuits including a gain stage circuit 16*y*1 to a gain stage circuit 16*y*N; N driving circuits including a driving circuit 20*y*1 to a driving circuit 20*y*N, a load circuit 24*y*1 and N coupling circuits including a coupling circuit 4*y*1 to a coupling circuit 4*y*N. The fifth low noise amplifier 40 is capable of amplifying and/or directly transmitting N (N≥2) input RF signals $RF_{in1}$ to $RF_{inN}$ and then outputting them.

FIG. 6A briefly illustrates the connection manner of the fifth low noise amplifier. In FIG. 6A, merely illustrated are the specific connections of the bypass circuit 140*y*1, the bypass circuit 140*y*N, the amplification selection switching circuit 8*y*1, the amplification selection switching circuit 8*y*N, the gain stage circuit 16*y*1, the gain stage circuit 16*y*N, the driving circuit 20*y*1, the driving circuit 20*y*N, the load circuit 24*y*1, the coupling circuit 4*y*1 and the coupling circuit 4*y*N.

Specifically, the coupling circuit 4*y*1 includes a coupling inductor 2*y*1 used for source electrode negative feedback; the gain stage circuit 16*y*1 includes a gain transistor 6*y*1; and the gain stage circuit 16*y*N includes a gain transistor 6*y*N. The gain transistors may employ various types of transistors. For example, in this embodiment, the gain transistor 6*y*1 and the gain transistor 6*y*N employ the NMOS transistor. A source electrode of the gain transistor 6*y*1 is connected to one terminal of the coupling inductor 2*y*1, and the other terminal of the coupling inductor 2*y*1 is grounded. A source electrode of the gain transistor 6*y*N is connected to one terminal of the coupling inductor 2*y*N, and the other terminal of the coupling inductor 2*y*N is grounded. In one or more embodiments, the source electrode of the gain transistor 6*y*1 and the source electrode of the gain transistor 6*y*N may be directly grounded.

The driving circuit 20*y*1 includes a driving transistor 22*y*1, and the driving circuit 20*y*N includes a driving transistor 22*y*N. The driving transistor 22*y*1 and the driving transistor 22*y*N may employ various types of transistors. A gate electrode of the driving transistor 22*y*1 is connected to a control voltage Vctrl1, and a gate electrode of the driving transistor 22*y*N is connected to a control voltage VctrlN. A source electrode of the driving transistor 22*y*1 is connected to a drain electrode of the gain transistor 6*y*1, and a source electrode of the driving transistor 22*y*N is connected to a drain electrode of the gain transistor 6*y*N. The magnitudes of the control voltage Vctrl1 and the control voltage VctrlN are generated by the control signal generation circuit, and may be correspondingly configured according to specific circuits.

The load circuit 24*y*1 includes a load inductor 34*y*1. One terminal of the load inductor 34*y*1 is connected to a power source voltage VDD. The other terminal of the load inductor 34*y*1, a drain electrode of the driving transistor 22*y*1, a drain electrode of the driving transistor 22*y*N, a bypass coupling capacitor 148*y*1 of the bypass circuit 140*y*1 and a bypass coupling capacitor 148*y*N of the bypass circuit 140*y*N are connected to each other to form a RF signal output terminal. Moreover, the load circuit 24*y*1 may further include one or more of a load capacitor, a load resistor and a balun transistor to provide an active load. The frequency response of the load circuit 24*y*1 may be narrowband or wideband.

The amplification selection switching circuit 8*y*1 includes a power source switch 10*y*1, a grounding switch 12*y*1 and a selection resistor 14*y*1. The amplification selection switching circuit 8*y*N includes a power source switch 10*y*N, a grounding switch 12*y*N and a selection resistor 14*y*N. One terminal of the power source switch 10*y*1 is connected to a bias voltage Vbias1, and the other terminal of the power source switch 10*y*1 is connected to one terminal of the selection resistor 14*y*1 and the grounding switch 12*y*1. The other terminal of the grounding switch 12*y*1 is grounded. The other terminal of the selection resistor 14*y*1 is connected to the gate electrode of the gain transistor 6*y*1 and one terminal of a bypass switch 146*y*1 of the bypass circuit 140*y*1. The other terminal of the bypass switch 146*y*1 is connected to one terminal of the bypass coupling capacitor 148*y*1. The other terminal of the bypass coupling capacitor 148*y*1 is connected to the RF output terminal OUT. One terminal of the power source switch 10*y*N is connected to a bias voltage VbiasN, and the other terminal of the power source switch 10*y*N is connected to one terminal of the selection resistor 14*y*N and the grounding switch 12*y*N. The other terminal of the grounding switch 12*y*N is grounded. The other terminal of the selection resistor 14*y*N is connected to the gate electrode of the gain transistor 6*y*N and one terminal of a bypass switch 146*y*N of the bypass circuit 140yN. The other terminal of the bypass switch 146yN is connected to one terminal of the bypass coupling capacitor 148yN. The other terminal of the bypass coupling capacitor 148yN is connected to a RF output terminal O1. The open/close states of the power source switch 10y1, the power source switch 10yN, the grounding switch 12y1, the grounding switch 12yN, the bypass coupling switch 146y1 and the bypass coupling switch 146yN are controlled by the control signal generation circuit. The frequencies or frequency bands of the RF signal $RF_{in1}$ to be amplified and the RF signal $RF_{in2}$ to be amplified may be the same or different, where $RF_{out1}$ denotes a RF output signal.

Functions of the N bypass circuits including the bypass circuit 140y1 to the bypass circuit 140yN; the N amplification selection switching circuits including the amplification selection switching circuit 8y1 to the amplification selection switching circuit 8yN; the N gain stage circuits including the gain stage circuit 16y1 to the gain stage circuit 16yN; the N driving circuits including the driving circuit 20y1 to the driving circuit 20yN, the load circuit 24y1 and the N coupling circuits including the coupling circuit 4y1 to the coupling circuit 4yN of the fifth low noise amplifier 40 in FIG. 6A are same with the corresponding descriptions of the functions of the bypass circuit 140xa, the bypass circuit 140ya, the amplification selection switching circuit 8xa, the amplification selection switching circuit 8ya, the gain stage circuit 16xa, the gain stage circuit 16ya, the driving circuit 20xa, the driving circuit 20ya, the load circuit 24xa, the coupling circuit 4xa and the coupling circuit 4ya of the first low noise amplifier 5 in FIG. 3. The first low noise amplifier 5 in FIG. 3 is merely an example of the fifth low noise amplifier 40 in FIG. 6A, in which N=2. The operation modes of the fifth low noise amplifier 40 are the same as the operation modes of the first low noise amplifier 5, and the specific operation process is not described herein again.

Figure 6B:
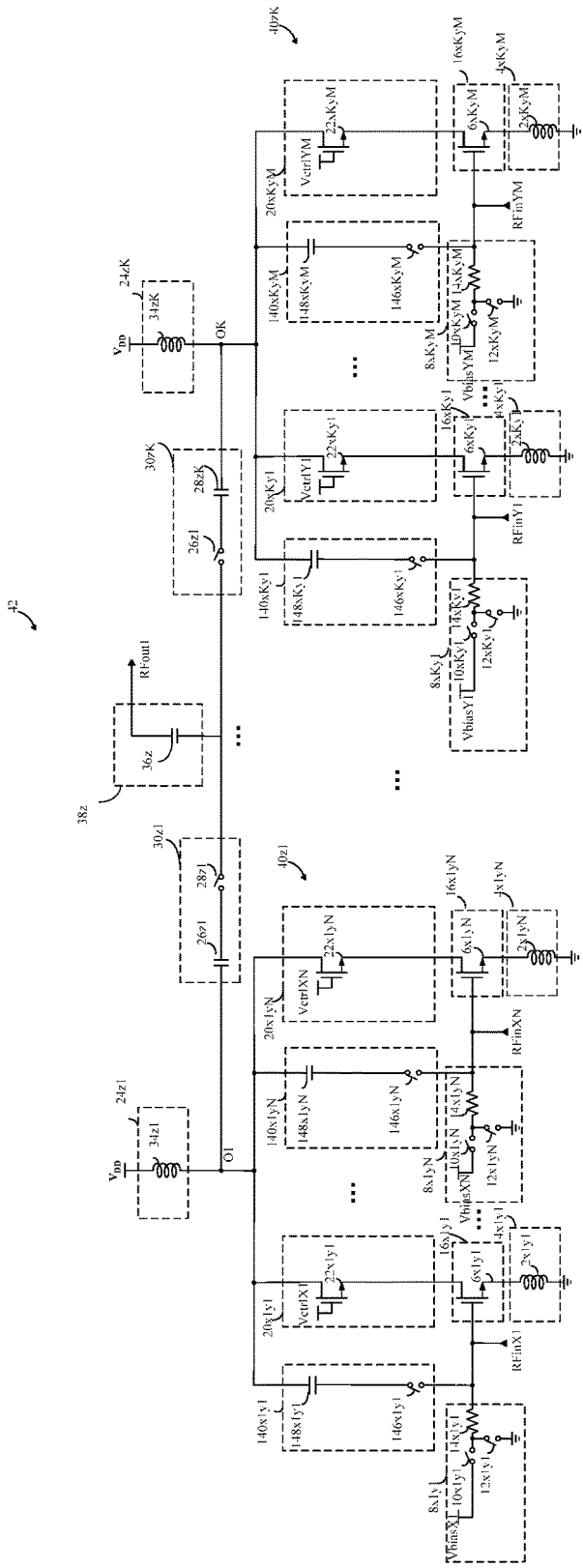
FIG. 6B is a schematic circuit diagram of another low noise amplifier according to an embodiment of the present disclosure.

FIG. 6B is a schematic circuit diagram of another low noise amplifier according to an embodiment of the present disclosure. As shown in FIG. 6B, this low noise amplifier includes K fifth low noise amplifiers (40z1 to 40zK), where K is greater than or equal to 2. The fifth low noise amplifier 40z1 includes: N bypass circuits including a bypass circuit 140x1y1 to a bypass circuit 140x1yN; N amplification selection switching circuits including an amplification selection switching circuit 8x1y1 to an amplification selection switching circuit 8x1yN; N gain stage circuits including a gain stage circuit 16x1y1 to a gain stage circuit 16x1yN; N driving circuits including a driving circuit 20x1y1 to a driving circuit 20x1yN, a load circuit 24z1 and N coupling circuits including a coupling circuit 4x1y1 to a coupling circuit 4x1yN. The fifth low noise amplifier 40z1 is capable of amplifying and/or directly transmitting N (N≥2) input RF signals $RF_{inX1}$ to $RF_{inXN}$ and then outputting them.

The fifth low noise amplifier 40zK includes: M bypass circuits including a bypass circuit 140xKy1 to a bypass circuit 140xKyM; M amplification selection switching circuits including an amplification selection switching circuit 8xKy1 to an amplification selection switching circuit 8xKyM; M gain stage circuits including a gain stage circuit 16xKy1 to a gain stage circuit 16xKyM; M driving circuits including a driving circuit 20xKy1 to a driving circuit 20xKyM, a load circuit 24zK and M coupling circuits including a coupling circuit 4xKy1 to a coupling circuit 4xKyM. The fifth low noise amplifier 40zK is capable of amplifying and/or directly transmitting M (M≥2) input RF signals $RF_{inY1}$ to $RF_{inYM}$ and then outputting them.

The low noise amplifier further includes an output DC blocking circuit 38z and K output selection circuits including an output selection circuit 30z1 to an output selection circuit 30zK.

FIG. 6B briefly illustrates the connection manner of this low noise amplifier. In FIG. 6B, merely illustrated are the specific connections of the fifth low noise amplifier 40z1, the fifth low noise amplifier 40zK, the output selection circuit 30z1, the output selection circuit 30zK and the output DC blocking circuit 38z.

In the fifth low noise amplifier 40z1, merely illustrated are the specific connections of the bypass circuit 140x1y1, the bypass circuit 140x1yN, the amplification selection switching circuit 8x1y1, the amplification selection switching circuit 8x1yN, the gain stage circuit 16x1y1, the gain stage circuit 16x1yN, the driving circuit 20x1y1, the driving circuit 20x1yN, the load circuit 24z1, the coupling circuit 4x1y1 and the coupling circuit 4x1yN.

Specifically, the coupling circuit 4x1y1 includes a coupling inductor 2x1y1 used for source electrode negative feedback; the gain stage circuit 16x1y1 includes a gain transistor 6x1y1; and the gain stage circuit 16x1yN includes a gain transistor 6x1yN. The gain transistors may employ various types of transistors. In this embodiment, both of the gain transistor 6x1y1 and the gain transistor 6x1yN employ the NMOS transistor. A source electrode of the gain transistor 6x1y1, a source electrode of the gain transistor 6x1yN and one terminal of the coupling inductor 2x1y1 are connected to each other. The other terminal of the coupling inductor 2x1y1 is grounded. In one or more embodiments, the source electrode of the gain transistor 6x1y1 and the source electrode of the gain transistor 6x1yN may be directly grounded.

The driving circuit 20x1y1 includes a driving transistor 22x1y1, and the driving circuit 20x1yN includes a driving transistor 22x1yN. The driving transistor 22x1y1 and the driving transistor 22x1yN may employ various types of transistors. In this embodiment, the driving transistor 22x1y1 and the driving transistor 22x1yN employ the NMOS transistors. A gate electrode of the driving transistor 22x1y1 is connected to a control voltage VctrlX1, and a gate electrode of the driving transistor 22x1yN is connected to a control voltage VctrlXN. A source electrode of the driving transistor 22x1y1 is connected to a drain electrode of the gain transistor 6x1y1, and a source electrode of the driving transistor 22x1yN is connected to a drain electrode of the gain transistor 6x1yN. The magnitudes of the control voltage VctrlX1 and the control voltage VctrlXN are generated by the control signal generation circuit, and may be correspondingly configured according to specific circuits.

The load circuit 24z1 includes a load inductor 34z1. One terminal of the load inductor 34z1 is connected to a power source voltage VDD. The other terminal of the load inductor 34z1, a drain electrode of the driving transistor 22x1y1, a drain electrode of the driving transistor 22x1yN, a bypass coupling capacitor 148x1y1 of the bypass circuit 140x1y1 and a bypass coupling capacitor 148x1yN of the bypass circuit 140x1yN are connected to each other to form a RF signal output terminal. Moreover, the load circuit 24z1 may further include one or more of a load capacitor, a load resistor and a balun transistor to provide an active load. The frequency response of the load circuit 24z1 may be narrowband or wideband.

The amplification selection switching circuit 8x1y1 includes a power source switch 10x1y1, a grounding switch 12x1y1 and a selection resistor 14x1y1. The amplification selection switching circuit 8x1yN includes a power source switch 10x1yN, a grounding switch 12x1yN and a selection resistor 14x1yN. One terminal of the power source switch 10x1y1 is connected to a bias voltage VbiasX1, and the other terminal of the power source switch 10x1y1 is connected to one terminal of the selection resistor 14x1y1 and one terminal of the grounding switch 12x1y1. The other terminal of the grounding switch 12x1y1 is grounded. The other terminal of the selection resistor 14x1y1 is connected to the gate electrode of the gain transistor 6x1y1 and one terminal of a bypass switch 146x1y1 of the bypass circuit 140x1y1. The other terminal of the bypass switch 146x1y1 is connected to one terminal of the bypass coupling capacitor 148x1y1. The other terminal of the bypass coupling capacitor 148x1y1 is connected to the RF output terminal O1. One terminal of the power source switch 10x1yN is connected to a bias voltage VbiasXN, and the other terminal of the power source switch 10x1yN is connected to one terminal of the selection resistor 14x1yN and one terminal of the grounding switch 12x1yN. The other terminal of the grounding switch 12x1yN is grounded. The other terminal of the selection resistor 14x1yN is connected to the gate electrode of the gain transistor 6x1yN and one terminal of a bypass switch 146x1yN of the bypass circuit 140x1yN. The other terminal of the bypass switch 146x1yN is connected to one terminal of the bypass coupling capacitor 148x1yN. The other terminal of the bypass coupling capacitor 148x1yN is connected to the RF output terminal O1. The open/close states of the power source switch 10x1y1, the power source switch 10x1yN, the grounding switch 12x1y1, the grounding switch 12x1yN, the bypass switch 146x1y1 and the bypass switch 146x1yN are controlled by the control signal generation circuit. The frequencies or frequency bands of the RF signal $RF_{inx1}$ to be amplified to the RF signal $RF_{inxN}$ to be amplified may be the same or different.

Functions of the N bypass circuits including the bypass circuit 140x1y1 to the bypass circuit 140x1yN; the N amplification selection switching circuits including the amplification selection switching circuit 8x1y1 to the amplification selection switching circuit 8x1yN; the N gain stage circuits including the gain stage circuit 16x1y1 to the gain stage circuit 16x1yN; the N driving circuits including the driving circuit 20x1y1 to the driving circuit 20x1yN, the load circuit 24z1 and the N coupling circuits including the coupling circuit 4x1y1 to the coupling circuit 4x1yN of the fifth low noise amplifier 40z1 in FIG. 6B are same with the functions of the bypass circuit 140xa, the bypass circuit 140ya, the amplification selection switching circuit 8xa, the amplification selection switching circuit 8ya, the gain stage circuit 16xa, the gain stage circuit 16ya, the driving circuit 20xa, the driving circuit 20ya, the load circuit 24xa, the coupling circuit 4xa and the coupling circuit 4ya of the first low noise amplifier 5 in FIG. 3, respectively. The first low noise amplifier 5 in FIG. 3 is merely an example of the fifth low noise amplifier 40z1 in FIG. 6B where N=2. The operation modes of the fifth low noise amplifier 40z1 are the same as the operation modes of the first low noise amplifier 5, and the specific operation process is not described herein again.

In the fifth low noise amplifier 40zK, merely illustrated are the specific connections of the bypass circuit 140xKy1, the bypass circuit 140xKyM, the amplification selection switching circuit 8xKy1, the amplification selection switching circuit 8xKyM, the gain stage circuit 16xKy1, the gain stage circuit 16xKyM, the driving circuit 20xKy1, the driving circuit 20xKyM, the load circuit 24zK, the coupling circuit 4xKy1 and the coupling circuit 4xKyM.

Specifically, the coupling circuit 4xKy1 includes a coupling inductor 2xKy1 used for source electrode negative feedback; the gain stage circuit 16xKy1 includes a gain transistor 6xKy1; and the gain stage circuit 16xKyM includes a gain transistor 6xKyM. The gain transistors may employ various types of transistors. In this embodiment, both of the gain transistor 6xKy1 and the gain transistor 6xKyM employ the NMOS transistors. A source electrode of the gain transistor 6xKy1, a source electrode of the gain transistor 6xKyM and one terminal of the coupling inductor 2xKy1 are connected to each other. The other terminal of the coupling inductor 2xKy1 is grounded. In one or more embodiments, the source electrode of the gain transistor 6xKy1 and the source electrode of the gain transistor 6xKyM may be directly grounded.

The driving circuit 20xKy1 includes a driving transistor 22xKy1, and the driving circuit 20xKyM includes a driving transistor 22xKyM. The driving transistor 22xKy1 and the driving transistor 22xKyM may employ various types of transistors. In this embodiment, the driving transistor 22xKy1 and the driving transistor 22xKyM employ the NMOS transistors. A gate electrode of the driving transistor 22xKy1 is connected to a control voltage VctrlY1. A gate electrode of the driving transistor 22xKyM is connected to a control voltage VctrlYM. A source electrode of the driving transistor 22xKy1 is connected to a drain electrode of the gain transistor 6xKy1. A source electrode of the driving transistor 22xKyM is connected to a drain electrode of the gain transistor 6xKyM. The magnitudes of the control voltage VctrlY1 and the control voltage VctrlYM are generated by the control signal generation circuit, and may be correspondingly configured according to specific circuits.

The load circuit 24zK includes a load inductor 34zK. One terminal of the load inductor 34zK is connected to the power source voltage VDD. The other terminal of the load inductor 34zK, a drain electrode of the driving transistor 22xKy1, a drain electrode of the driving transistor 22xKyM, a bypass coupling capacitor 148xKy1 of the bypass circuit 140xKy1 and a bypass coupling capacitor 148xKyM of the bypass circuit 140xKyM are connected to each other to form a RF signal output terminal. Moreover, the load circuit 24zK may further include one or more of a load capacitor, a load resistor and a balun transistor to provide an active load. The frequency response of the load circuit 24zK may be narrowband or wideband.

The amplification selection switching circuit 8xKy1 includes a power source switch 10xKy1, a grounding switch 12xKy1 and a selection resistor 14xKy1. The amplification selection switching circuit 8xKyM includes a power source switch 10xKyM, a grounding switch 12xKyM and a selection resistor 14xKyM. One terminal of the power source switch 10xKy1 is connected to a bias voltage VbiasY1, and the other terminal of the power source switch 10xKy1 is connected to one terminal of the selection resistor 14xKy1 and the grounding switch 12xKy1. The other terminal of the grounding switch 12xKy1 is grounded. The other terminal of the selection resistor 14xKy1 is connected to the gate electrode of the gain transistor 6xKy1 and one terminal of a bypass switch 146xKy1 of the bypass circuit 140xKy1. The other terminal of the bypass switch 146xKy1 is connected to one terminal of the bypass coupling capacitor 148xKy1. The other terminal of the bypass coupling capacitor 148xKy1 is connected to the RF output terminal OK. One terminal of the power source switch 10xKyM is connected to a bias voltage VbiasYM, and the other terminal of the power source switch 10xKyM is connected to one terminal of the selection resistor 14xKyM and one terminal of the grounding switch 12xKyM. The other terminal of the grounding switch 12xKyM is grounded. The other terminal of the selection resistor 14xKyM is connected to the gate electrode of the gain transistor 6xKyM and one terminal of a bypass switch 146xKyM of the bypass circuit 140xKyM. The other terminal of the bypass switch 146xKyM is connected to one terminal of the bypass coupling capacitor 148xKyM. The other terminal of the bypass coupling capacitor 148xKyM is connected to the RF output terminal OK. The open/close states of the power source switch 10xKy1, the power source switch 10xKyM, the grounding switch 12xKy1, the grounding switch 12xKyM, the bypass coupling switch 146xKy1 and the bypass switch 146xKyM are controlled by the control signal generation circuit. The frequencies or frequency bands of the RF signal $RF_{inY1}$ to be amplified to the RF signal $RF_{inYM}$ to be amplified may be the same or different.

Functions of the M bypass circuits including the bypass circuit 140xKy1 to the bypass circuit 140xKyM; the M amplification selection switching circuits including the amplification selection switching circuit 8xKy1 to the amplification selection switching circuit 8xKyM; the M gain stage circuits including the gain stage circuit 16xKy1 to the gain stage circuit 16xKyM; the M driving circuits including the driving circuit 20xKy1 to the driving circuit 20xKyM, the load circuit 24zK and the M coupling circuits including the coupling circuit 4xKy1 to the coupling circuit 4xKyM of the fifth low noise amplifier 40zK in FIG. 6B are same with the functions of the bypass circuit 140xa, the bypass circuit 140ya, the amplification selection switching circuit 8xa, the amplification selection switching circuit 8ya, the gain stage circuit 16xa, the gain stage circuit 16ya, the driving circuit 20xa, the driving circuit 20ya, the load circuit 24xa, the coupling circuit 4xa and the coupling circuit 4ya of the first low noise amplifier 5 in FIG. 3. The first low noise amplifier 5 in FIG. 3 is merely an example of the fifth low noise amplifier 40zK in FIG. 6B where M=2. The operation modes of the fifth low noise amplifier 40zK are the same as the operation modes of the first low noise amplifier 5, and the specific operation process is not described herein again.

The output selection circuit 30z1 includes a DC blocking capacitor 26z1 and an output selection switch 28z1. One terminal of the DC blocking capacitor 26z1 is connected to the output terminal O1 of the fifth low noise amplifier 40z1. The other terminal of the DC blocking capacitor 26z1 is connected to one terminal of the output selection switch 28z1. The other terminal of the output selection switch 28z1 is connected to the RF output terminal through an output DC blocking capacitor 36z.

The output selection circuit 30zK includes a DC blocking capacitor 26zK and an output selection switch 28zK. One terminal of the DC blocking capacitor 26zK is connected to the output terminal OK of the fifth low noise amplifier 40zK. The other terminal of the DC blocking capacitor 26zK is connected to one terminal of the output selection switch 28zK. The other terminal of the output selection switch 28zK is connected to the RF output terminal through the output DC blocking capacitor 36z.

During specific implementations, the K output selection circuits (30Z1 to 30zK) receive one or more RF signals from the K fifth low noise amplifiers (40z1 to 40zK), and the one or more RF signals are outputted through the DC blocking capacitor 36z by means of controlling the K output selection switches 28z1 to 28zK to be closed or opened by control signals.

Figure 6C:
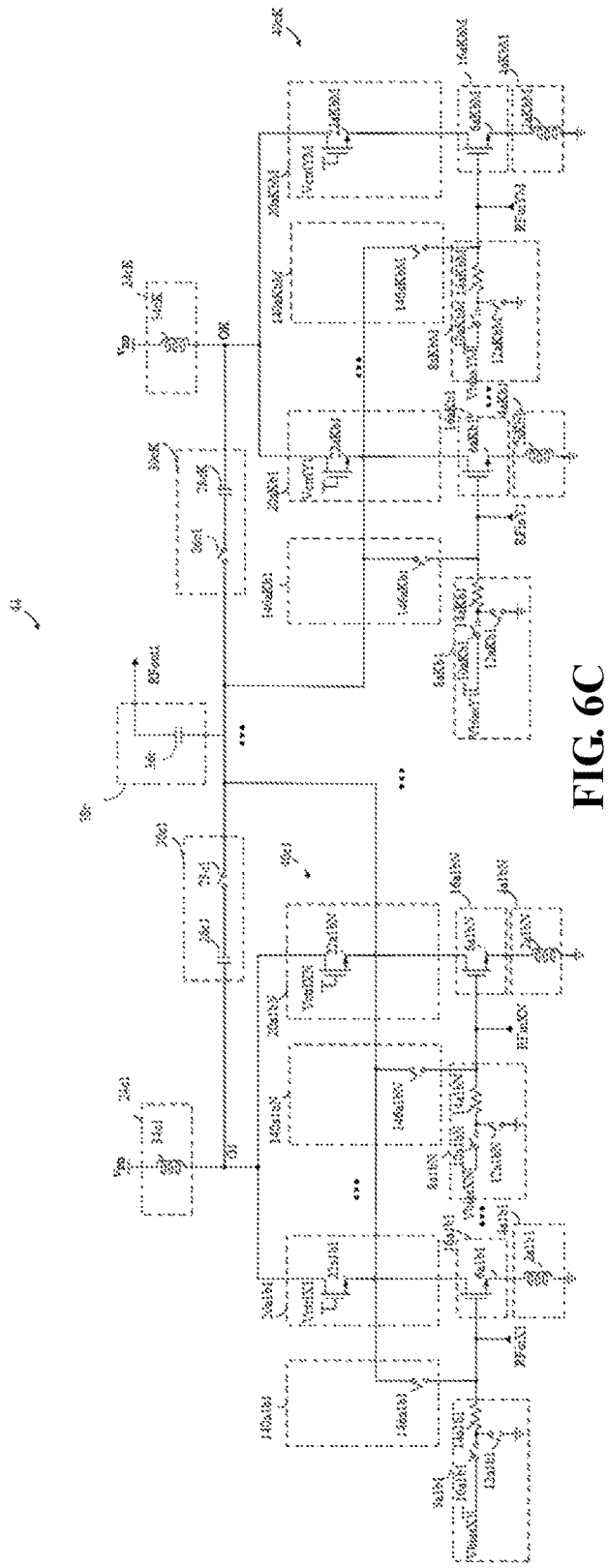
FIG. 6C is a schematic circuit diagram of another low noise amplifier according to an embodiment of the present disclosure.

FIG. 6C is a schematic circuit diagram of another low noise amplifier according to an embodiment of the present disclosure. As shown in FIG. 6C, this amplifier includes K fifth low noise amplifiers (40c1 to 40cK), where K is greater than or equal to 2. The fifth low noise amplifier 40c1 includes: N bypass circuits including a bypass circuit 140a1b1 to a bypass circuit 140a1bN; N amplification selection switching circuits including an amplification selection switching circuit 8a1b1 to an amplification selection switching circuit 8a1bN; N gain stage circuits including a gain stage circuit 16a1b1 to a gain stage circuit 16a1bN; N driving circuits including a driving circuit 20a1b1 to a driving circuit 20a1bN, a load circuit 24c1 and N coupling circuits including a coupling circuit 4a1b1 to a coupling circuit 4a1bN. The fifth low noise amplifier 40c1 is capable of amplifying and/or directly transmitting N (N≥2) input RF signals $RF_{inX1}$ to $RF_{inXN}$ and then outputting them.

The fifth low noise amplifier 40cK includes: M bypass circuits including a bypass circuit 140aKb1 to a bypass circuit 140aKbM; M amplification selection switching circuits including an amplification selection switching circuit 8aKb1 to an amplification selection switching circuit 8aKbM; M gain stage circuits including a gain stage circuit 16aKb1 to a gain stage circuit 16aKbM; M driving circuits including a driving circuit 20aKb1 to a driving circuit 20aKbM, a load circuit 24cK and M coupling circuits including a coupling circuit 4aKb1 to a coupling circuit 4aKbM. The fifth low noise amplifier 40cK is capable of amplifying and/or directly transmitting M (M≥2) input RF signals $RF_{inY1}$ to $RF_{inYM}$ and then outputting them.

The low noise amplifier further includes an output DC blocking circuit 38c and K output selection circuits 30c1 to 30cK.

FIG. 6C briefly illustrates the connection manner of the sixth low noise amplifier. In FIG. 6C, merely illustrated are the specific connections of the fifth low noise amplifier 40c1, the fifth low noise amplifier 40cK, the output selection circuit 30c1, the output selection circuit 30cK and the output DC blocking circuit 38c.

In the fifth low noise amplifier 40c1, merely illustrated are the specific connections of the bypass circuit 140a1b1, the bypass circuit 140a1bN, the amplification selection switching circuit 8a1b1, the amplification selection switching circuit 8a1bN, the gain stage circuit 16a1b1, the gain stage circuit 16a1bN, the driving circuit 20a1b1, the driving circuit 20a1bN, the load circuit 24c1, the coupling circuit 4a1b1 and the coupling circuit 4a1bN.

Specifically, the coupling circuit 4a1b1 includes a coupling inductor 2a1b1 used for source electrode negative feedback; the gain stage circuit 16a1b1 includes a gain transistor 6a1b1; and the gain stage circuit 16a1bN includes a gain transistor 6a1bN. The gain transistors may employ various types of transistors. In this embodiment, both of the gain transistor 6a1b1 and the gain transistor 6a1bN employ the NMOS transistor. A source electrode of the gain transistor 6a1b1, a source electrode of the gain transistor 6a1bN and one terminal of the coupling inductor 2a1b1 are connected to each other. The other terminal of the coupling inductor 2a1b1 is grounded. In one or more embodiments, the source electrode of the gain transistor 6a1b1 and the source electrode of the gain transistor 6a1bN may be directly grounded.

The driving circuit 20a1b1 includes a driving transistor 22a1b1, and the driving circuit 20a1bN includes a driving transistor 22a1bN. The driving transistor 22a1b1 and the driving transistor 22a1bN may employ various types of transistors. In this embodiment, the driving transistor 22a1b1 and the driving transistor 22a1bN employ the NMOS transistors. A gate electrode of the driving transistor 22a1b1 is connected to a control voltage VctrlY1, and a gate electrode of the driving transistor 22a1bN is connected to a control voltage VctrlYN. A source electrode of the driving transistor 22a1b1 is connected to a drain electrode of the gain transistor 6a1b1, and a source electrode of the driving transistor 22a1bN is connected to a drain electrode of the gain transistor 6a1bN. The magnitudes of the control voltage VctrlY1 to the control voltage VctrlYN are generated by the control signal generation circuit, and may be correspondingly configured according to specific circuits.

The load circuit 24c1 includes a load inductor 34c1. One terminal of the load inductor 34c1 is connected to a power source voltage VDD. The other terminal of the load inductor 34c1, a drain electrode of the driving transistor 22a1b1, a drain electrode of the driving transistor 22a1bN, a bypass coupling capacitor 148a1b1 of the bypass circuit 140a1b1 and a bypass coupling capacitor 148a1bN of the bypass circuit 140a1bN are connected to each other to form a RF signal output terminal. Moreover, the load circuit 24c1 may further include one or more of a load capacitor, a load resistor and a balun transistor to provide an active load. The frequency response of the load circuit 24c1 may be narrowband or wideband.

The amplification selection switching circuit 8a1b1 includes a power source switch 10a1b1, a grounding switch 12a1b1 and a selection resistor 14a1b1. The amplification selection switching circuit 8a1bN includes a power source switch 10a1bN, a grounding switch 12a1bN and a selection resistor 14a1bN. One terminal of the power source switch 10a1b1 is connected to a bias voltage VbiasX1, and the other terminal of the power source switch 10a1b1 is connected to one terminal of the selection resistor 14a1b1 and the grounding switch 12a1b1. The other terminal of the grounding switch 12a1b1 is grounded. The other terminal of the selection resistor 14a1b1 is connected to the gate electrode of the gain transistor 6a1b1 and one terminal of the bypass switch 146a1b1 of the bypass circuit 140a1b1. The other terminal of the bypass switch 146a1b1 is connected to one terminal of an output DC blocking capacitor 36c. The other terminal of the output DC blocking capacitor 36c is connected to the RF output terminal.

One terminal of the power source switch 10a1bN is connected to a bias voltage VbiasXN, and the other terminal of the power source switch 10a1bN is connected to one terminal of the selection resistor 14a1bN and the grounding switch 12a1bN. The other terminal of the grounding switch 12a1bN is grounded. The other terminal of the selection resistor 14a1bN is connected to the gate electrode of the gain transistor 6a1bN and one terminal of a bypass switch 146a1bN of the bypass circuit 140a1bN. The other terminal of the bypass switch 146a1bN is connected to the one terminal of the output DC blocking capacitor 36c. The other terminal of the output DC blocking capacitor 36c is connected to the RF output terminal.

The open/close states of the power source switch 10a1b1, the power source switch 10a1bN, the grounding switch 12a1b1, the grounding switch 12a1bN, the bypass coupling switch 146a1b1 and the bypass coupling switch 146a1bN are controlled by the control signal generation circuit. The frequencies or frequency bands of the RF signal $RF_{inx1}$ to be amplified to the RF signal $RF_{inXN}$ to be amplified may be the same or different.

Functions of the N bypass circuits including the bypass circuit 140a1b1 to the bypass circuit 140a1bN; the N amplification selection switching circuits including the amplification selection switching circuit 8a1b1 to the amplification selection switching circuit 8a1bN; the N gain stage circuits including the gain stage circuit 16a1b1 to the gain stage circuit 16a1bN; the N driving circuits including the driving circuit 20a1b1 to the driving circuit 20a1bN, the load circuit 24c1 and the N coupling circuits including the coupling circuit 4a1b1 to the coupling circuit 4a1bN of the fifth low noise amplifier 40c1 in FIG. 6C are same with the functions of the bypass circuit 140xa, the bypass circuit 140ya, the amplification selection switching circuit 8xa, the amplification selection switching circuit 8ya, the gain stage circuit 16xa, the gain stage circuit 16ya, the driving circuit 20xa, the driving circuit 20ya, the load circuit 24xa, the coupling circuit 4xa and the coupling circuit 4ya of the first low noise amplifier 5 in FIG. 3, respectively. The first low noise amplifier 5 in FIG. 3 is merely an example of the fifth low noise amplifier 40c1 in FIG. 6C where N=2. The operation modes of the fifth low noise amplifier 40c1 are the same as the operation modes of the first low noise amplifier 5, and the specific operation process is not described herein again.

In the fifth low noise amplifier 40cK, merely illustrated are the specific connections of the bypass circuit 140aKb1, the bypass circuit 140aKbM, the amplification selection switching circuit 8aKb1, the amplification selection switching circuit 8aKbM, the gain stage circuit 16aKb1, the gain stage circuit 16aKbM, the driving circuit 20aKb1, the driving circuit 20aKbM, the load circuit 24cK, the coupling circuit 4aKb1 and the coupling circuit 4aKbM.

Specifically, the coupling circuit 4aKb1 includes a coupling inductor 2aKb1 used for source electrode negative feedback; the gain stage circuit 16aKb1 includes a gain transistor 6aKb1; and the gain stage circuit 16aKbM includes a gain transistor 6aKbM. The gain transistors may employ various types of transistors. In this embodiment, both of the gain transistor 6aKb1 and the gain transistor 6aKbM employ the NMOS transistors. A source electrode of the gain transistor 6aKb1, a source electrode of the gain transistor 6aKbM and one terminal of the coupling inductor 2aKb1 are connected to each other. The other terminal of the coupling inductor 2aKb1 is grounded. In one or more embodiments, the source electrode of the gain transistor 6aKb1 and the source electrode of the gain transistor 6aKbM may be directly grounded.

The driving circuit 20aKb1 includes a driving transistor 22aKb1, and the driving circuit 20aKbM includes a driving transistor 22aKbM. The driving transistor 22aKb1 and the driving transistor 22aKbM may employ various types of transistors. In this embodiment, the driving transistor 22aKb1 and the driving transistor 22aKbM employ the NMOS transistors. A gate electrode of the driving transistor 22aKb1 is connected to a control voltage VctrlY1, and a gate electrode of the driving transistor 22aKbM is connected to a control voltage VctrlYM. A source electrode of the driving transistor 22aKb1 is connected to a drain electrode of the gain transistor 6aKb1, and a source electrode of the driving transistor 22aKbM is connected to a drain electrode of the gain transistor 6aKbM. The magnitudes of the control voltage VctrlY1 to the control voltage VctrlYM are generated by the control signal generation circuit, and may be correspondingly configured according to specific circuits.

The load circuit 24cK includes a load inductor 34cK. One terminal of the load inductor 34cK is connected to the power source voltage VDD. The other terminal of the load inductor 34cK, a drain electrode of the driving transistor 22aKb1, a drain electrode of the driving transistor 22aKbM, a bypass coupling capacitor 148aKb1 of the bypass circuit 140aKb1 and a bypass coupling capacitor 148aKbM of the bypass circuit 140aKbM are connected to each other to form a RF signal output terminal. Moreover, the load circuit 24cK may further include one or more of a load capacitor, a load resistor and a balun transistor to provide an active load. The frequency response of the load circuit 24cK may be narrowband or wideband.

The amplification selection switching circuit 8aKb1 includes a power source switch 10aKb1, a grounding switch 12aKb1 and a selection resistor 14aKb1. The amplification selection switching circuit 8aKbM includes a power source switch 10aKbM, a grounding switch 12aKbM and a selection resistor 14aKbM. One terminal of the power source switch 10aKb1 is connected to a bias voltage VbiasY1, and the other terminal of the power source switch 10aKb1 is connected to one terminal of the selection resistor 14aKb1 and the grounding switch 12aKb1. The other terminal of the grounding switch 12aKb1 is grounded. The other terminal of the selection resistor 14aKb1 is connected to the gate electrode of the gain transistor 6aKb1 and one terminal of the bypass switch 146aKb1 of the bypass circuit 140aKb1. The other terminal of the bypass switch 146aKb1 is connected to one terminal of the output DC blocking capacitor 36c. The other terminal of the output DC blocking capacitor 36c is connected to the RF output terminal.

One terminal of the power source switch 10aKbM is connected to a bias voltage VbiasYM, and the other terminal of the power source switch 10aKbM is connected to one terminal of the selection resistor 14aKbM and the grounding switch 12aKbM. The other terminal of the grounding switch 12aKbM is grounded. The other terminal of the selection resistor 14aKbM is connected to the gate electrode of the gain transistor 6aKbM and one terminal of a bypass switch 146aKbM of the bypass circuit 140aKbM. The other terminal of the bypass switch 146aKbM is connected to the one terminal of the output DC blocking capacitor 36c. The other terminal of the output DC blocking capacitor 36c is connected to the RF output terminal.

The open/close states of the power source switch 10aKb1, the power source switch 10aKbM, the grounding switch 12aKb1, the grounding switch 12aKbM, the bypass switch 146aKb1 and the bypass switch 146aKbM are controlled by the control signal generation circuit. The frequencies or frequency bands of the RF signal $RF_{in_{Y1}}$ to be amplified to the RF signal $RF_{in_{YN}}$ to be amplified may be the same or different.

Functions of the M bypass circuits including the bypass circuit 140aKb1 to the bypass circuit 140aKbM; the M amplification selection switching circuits including the amplification selection switching circuit 8aKb1 to the amplification selection switching circuit 8aKbM; the M gain stage circuits including the gain stage circuit 16aKb1 to the gain stage circuit 16aKbM; the M driving circuits including the driving circuit 20aKb1 to the driving circuit 20aKbM, the load circuit 24cK and the M coupling circuits including the coupling circuit 4aKb1 to the coupling circuit 4aKbM of the fifth low noise amplifier 40cK in FIG. 6C are same with the functions of the bypass circuit 140xa, the bypass circuit 140ya, the amplification selection switching circuit 8xa, the amplification selection switching circuit 8ya, the gain stage circuit 16xa, the gain stage circuit 16ya, the driving circuit 20xa, the driving circuit 20ya, the load circuit 24xa, the coupling circuit 4xa and the coupling circuit 4ya of the first low noise amplifier 5 in FIG. 3, respectively. The first low noise amplifier 5 in FIG. 3 is merely an example of the fifth low noise amplifier 40cK in FIG. 6C where M=2. The operation modes of the fifth low noise amplifier 40cK are same as the operation modes of the first low noise amplifier 5, and the specific operation process is not described herein again.

The output selection circuit 30c1 includes a DC blocking capacitor 26c1 and an output selection switch 28c1. One terminal of the DC blocking capacitor 26c1 is connected to the output terminal O1 of the fifth low noise amplifier 40c1. The other terminal of the DC blocking capacitor 26c1 is connected to one terminal of the output selection switch 28c1. The other terminal of the output selection switch 28c1 is connected to the RF output terminal through the output DC blocking capacitor 36c.

The output selection circuit 30cK includes a DC blocking capacitor 26cK and an output selection switch 28cK. One terminal of the DC blocking capacitor 26cK is connected to the output terminal OK of the fifth low noise amplifier 40cK. The other terminal of the DC blocking capacitor 26cK is connected to one terminal of the output selection switch 28cK. The other terminal of the output selection switch 28cK is connected to the RF output terminal through the output DC blocking capacitor 36c.

During specific implementations, the K output selection circuits (30c1 to 30cK) receive one or more RF signals from the K fifth low noise amplifiers (40c1 to 40cK), and the one or more RF signals are outputted through the DC blocking capacitor 36c by controlling the K output selection switches 28c1 to 28cK to be closed or opened by control signals.

Figure 7:
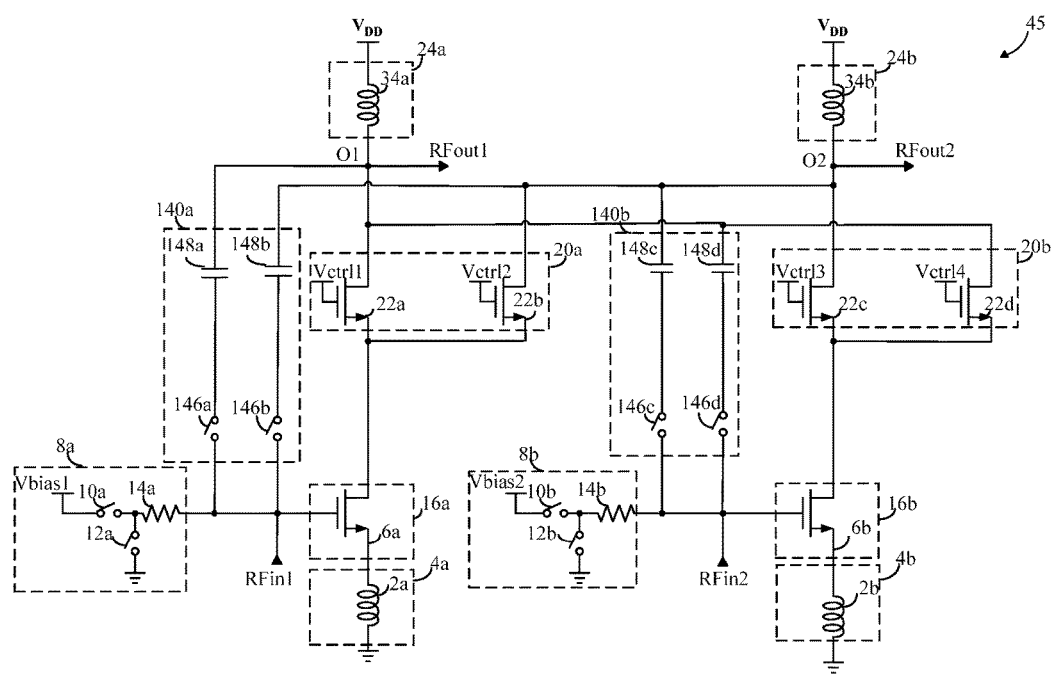
FIG. 7 is a schematic circuit diagram of another low noise amplifier according to an embodiment of the present disclosure.

FIG. 7 is a schematic circuit diagram of another low noise amplifier according to an embodiment of the present disclosure. As shown in FIG. 7, a sixth low noise amplifier 45 includes: a bypass circuit 140a, a bypass circuit 140b, an amplification selection switching circuit 8a, an amplification selection switching circuit 8b, a gain stage circuit 16a, a gain stage circuit 16b, a driving circuit 20a, a driving circuit 20b, a load circuit 24b, a coupling circuit 4a and a coupling circuit 4b. The sixth low noise amplifier 45 is capable of amplifying and/or directly transmitting two inputted RF signals $RF_{in1}$ and $RF_{in2}$ and then outputting them.

Specifically, the coupling circuit 4a includes a coupling inductor 2a used for source electrode negative feedback; the coupling circuit 4b includes a coupling inductor 2b for source electrode negative feedback; the gain stage circuit 16a includes a gain transistor 6a; and the gain stage circuit 16b includes a gain transistor 6b. The gain transistor 6a and the gain transistor 6b may employ various types of transistors. For example, in this embodiment, both of the gain transistor 6a and the gain transistor 6b employ the NMOS transistors. A source electrode of the gain transistor 6a is connected to one terminal of the coupling inductor 2a, and the other terminal of the coupling inductor 2a is grounded. A source electrode of the gain transistor 6b is connected to one terminal of the coupling inductor 2b, and the other terminal of the coupling inductor 2b is grounded. In one or more embodiments, the source electrode of the gain transistor 6a and the source electrode of the gain transistor 6b may be directly grounded, or may be grounded through the coupling inductor 2a.

The driving circuit 20a includes a driving transistor 22a and a driving transistor 22b, and the driving circuit 20b includes a driving transistor 22c and a driving transistor 22d. The driving transistors 22a to 22d may employ various types of transistors. For example, in this embodiment, the driving transistors employ the NMOS transistors. A gate electrode of the driving transistor 22a is connected to a control voltage Vctrl1, and a gate electrode of the driving transistor 22b is connected to a control voltage Vctrl2. A gate electrode of the driving transistor 22c is connected to a control voltage Vctrl3, and a gate electrode of the driving transistor 22d is connected to a control voltage Vctrl4. A source electrode of the driving transistor 22a is connected to a source electrode of the driving transistor 22b and a drain electrode of the gain transistor 6a. A source electrode of the driving transistor 22c is connected to a source electrode of the driving transistor 22d and a drain electrode of the gain transistor 6b. The magnitudes of the control voltage Vctrl1, the control voltage Vctrl2, the control voltage Vctrl3 and the control voltage Vctrl4 are generated by the control signal generation circuit, and may be correspondingly configured according to specific circuits.

The load circuit 24a includes a load inductor 34a. The load circuit 24b includes a load inductor 34b. One terminal of the load inductor 34a is connected to a power source voltage VDD. The other terminal of the load inductor 34a, a drain electrode of the driving transistor 22a, a drain electrode of the driving transistor 22d, a bypass coupling capacitor 148a of the bypass circuit 140a and a bypass coupling capacitor 148d of the bypass circuit 140b are connected to each other to form a first RF signal output terminal. One terminal of the load inductor 34b is connected to the power source voltage VDD. The other terminal of the load inductor 34b, a drain electrode of the driving transistor 22b, a drain electrode of the driving transistor 22c, a bypass coupling capacitor 148b of the bypass circuit 140a and a bypass coupling capacitor 148c of the bypass circuit 140b are connected to each other to form a second RF signal output terminal. Moreover, the load circuit 24a and the load circuit 24b may further include one or more of a load capacitor, a load resistor and a balun transistor to provide an active load. The frequency responses of the load circuit 24a and the load circuit 24b may be narrowband or wideband.

The amplification selection switching circuit 8a includes a power source switch 10a, a grounding switch 12a and a selection resistor 14a. The amplification selection switching circuit 8b includes a power source switch 10b, a grounding switch 12b and a selection resistor 14b. One terminal of the power source switch 10a is connected to a bias voltage Vbias1, and the other terminal of the power source switch 10a is connected to one terminal of the selection resistor 14a and one terminal of the grounding switch 12a. The other terminal of the grounding switch 12a is grounded. The other terminal of the selection resistor 14a is connected to the gate electrode of the gain transistor 6a, one terminal of the bypass switch 146a of the bypass circuit 140a and one terminal of the bypass switch 146b of the bypass circuit 140a. The other terminal of the bypass switch 146a is connected to one terminal of the bypass coupling capacitor 148a, and the other terminal of the bypass coupling capacitor 148a is connected to the first RF output terminal. The other terminal of the bypass switch 146b is connected to one terminal of the bypass coupling capacitor 148b, and the other terminal of the bypass coupling capacitor 148b is connected to the first RF output terminal. One terminal of the power source switch 10b is connected to a bias voltage Vbias2, and the other terminal of the power source switch 10b is connected to one terminal of the selection resistor 14b and the grounding switch 12b. The other terminal of the grounding switch 12b is grounded. The other terminal of the selection resistor 14b is connected to the gate electrode of the gain transistor 6b, one terminal of the bypass switch 146c of the bypass circuit 140b and one terminal of the bypass switch 146d of the bypass circuit 140b. The other terminal of the bypass switch 146c is connected to one terminal of the bypass coupling capacitor 148c, and the other terminal of the bypass coupling capacitor 148c is connected to the second RF output terminal. The other terminal of the bypass switch 146d is connected to one terminal of the bypass coupling capacitor 148d, and the other terminal of the bypass coupling capaci-tor 148d is connected to the second RF output terminal. The open/close states of the power source switch 10a, the power source switch 10b, the grounding switch 12a, the grounding switch 12b, the bypass coupling switch 146a, the bypass coupling switch 146b, the bypass coupling switch 146c and the bypass coupling switch 146d are controlled by the control signal generation circuit. The frequencies or frequency bands of the RF signals to be amplified $RF_{in1}$ and $RF_{in2}$ may be the same or different. As shown in FIG. 7, the low noise amplifier includes two RF input terminals and two RF output terminals.

In an exemplarily design, the gain stage circuit 16a and the gain stage circuit 16b may be individually enabled (that is, turned on) or individually disabled (that is, turned off). Specifically, (i) the power source switch 10a is closed (that is, turned on), and the grounding switch 12a, the bypass switch 146a and the bypass switch 146b are opened (that is, turned off), such that the bias voltage Vbias1 is applied to the gate electrode of the gain transistor 6a, causing the gain transistor 6a to be enabled, or (ii) the power source switch 10a is opened and the grounding switch 12a is closed, causing the gate electrode of the gain transistor 6a to be grounded through the selection resistor 14a, such that the gain transistor 6a is turned off. The process of enabling and disabling the gain transistor 6b is similar as that of the gain transistor 6a, and is not described here again.

In an exemplarily design, the bypass circuit 140a and the bypass circuit 140b may be individually enabled (that is, turned on) or individually disabled (that is, turned off). Specifically, (i) the bypass switch 146a and/or the bypass switch 146b are closed, the grounding switch 12a is grounded and the power source switch 10a is opened, such that the gain transistor 6a is turned off, the bypass circuit 140a is enabled, and the RF input signal is transmitted to the first RF output terminal and/or the second RF output terminal through the bypass coupling capacitor 148a and/or the bypass coupling capacitor 148b. (ii) the bypass switch 146a and the bypass switch 146b are opened, and hence the bypass circuit 140a is disabled. The process of enabling and disabling the bypass circuit 140b is similar as that of the bypass circuit 140a, and is not described here again.

The sixth low noise amplifier 45 may include a first operation mode, a second operation mode and a third operation mode. In the first operation mode, the bypass circuits are disabled, and one or more of the plurality of the gain stage circuits are enabled to obtain one or more amplified RF signals.

In the second operation mode, the gain stage circuits are disabled, and one or more of the plurality of bypass circuits are enabled to obtain one or more RF transmission signals for mitigating the distortion caused by the excessive amplitude of the RF signal.

In the third operation mode, one or more of the plurality of gain stage circuits and one or more of the plurality of bypass circuits are enabled to obtain one or more amplified RF signals and one or more RF transmission signals.

Figure 8A:
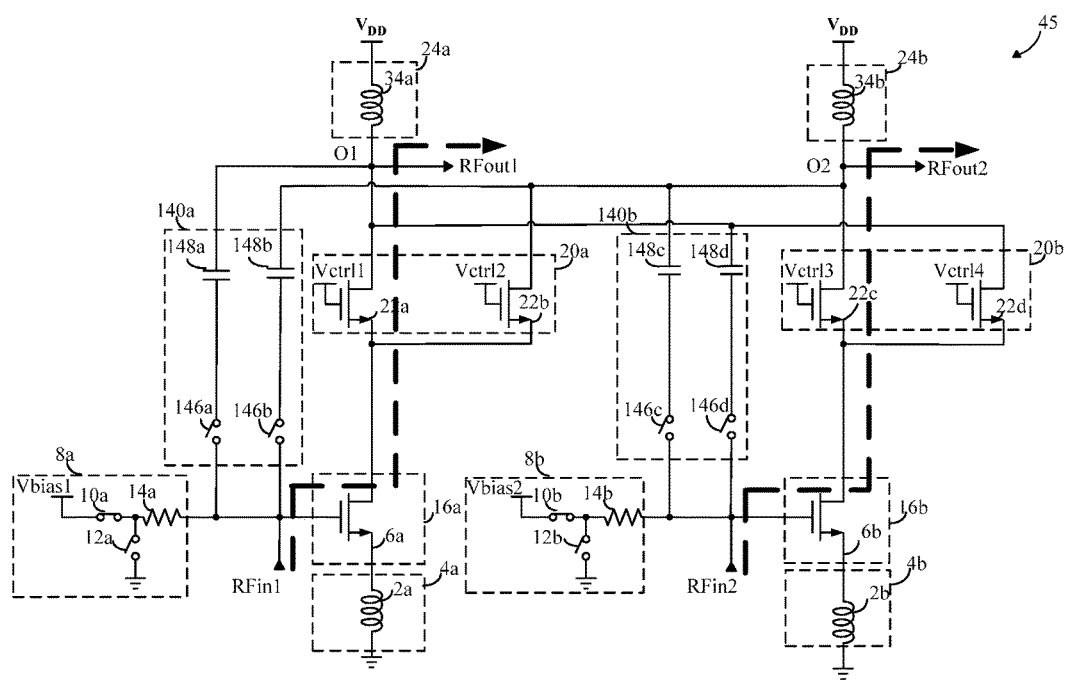
FIGS. 8A and 8B are diagrams showing two example operations of a first operation mode of the low noise amplifier shown in FIG. 7.

FIG. 8A is a diagram showing an example of the first operation mode of the low noise amplifier shown in FIG. 7. As shown in FIG. 8A, during the specific implementation, in the sixth low noise amplifier 45, the grounding switch 12a is opened, the bypass switches 146a and 146b are opened, the power source switch 10a is closed, the bias voltage Vbias1 is applied to the gate electrode of the gain transistor 6a via the selection resistor 14a accordingly, the gain transistor 6a is turned on to amplify the input RF signal $RF_{in1}$, the driving transistor 22a is turned on by the control voltage Vctrl1, and the driving transistor 22b is turned off by the control voltage Vctrl2, such that the RF signal amplified by the gain transistor 6a is transmitted to the load circuit 24a through the driving transistor 22a, and operates with the load inductor 34a to generate an output RF signal RFout1.

Further, the grounding switch 12b is opened, the bypass switches 146c and 146d are opened, the power source switch 10b is closed, the bias voltage Vbias2 is applied to the gate electrode of the gain transistor 6b via the selection resistor 14b, the gain transistor 6b is turned on to amplify the input RF signal $RF_{in2}$, the driving transistor 22c is turned on by the control voltage Vctrl3 and the driving transistor 22d is turned off by the control voltage Vctrl4, such that the RF signal amplified by the gain transistor 6b is transmitted to the load circuit 24b through the driving transistor 22c, and operates with the load inductor 34b to generate an output RF signal RFout2.

FIG. 8A is merely a non-exclusive operation example of the first operation mode of the sixth low noise amplifier 45. Specifically, in the first operation mode of the sixth low noise amplifier 45, all the bypass circuits are controlled to be turned off through the control signal generation circuit, and the amplification switch selection circuits are arranged and the driving circuits are controlled to be turned on and turned off, such that one or more RF input signals are amplified through the gain stage circuits, the amplified RF signals are transmitted to the load circuits through the driving circuits and operate with the load circuits to generate and output one or more RF output signals.

Figure 8B:
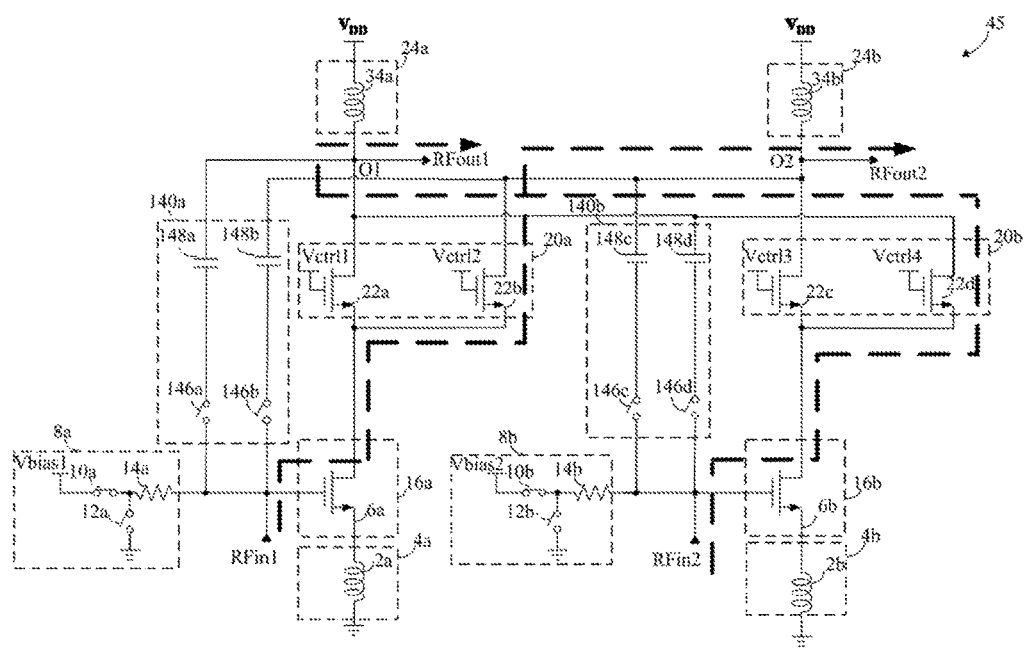

FIG. 8B is a diagram showing another example of the first operation mode of the low noise amplifier shown in FIG. 7. As shown in FIG. 8B, during the specific implementation, the grounding switch 12a is opened, the bypass switches 146a and 146b are opened, the power source switch 10a is closed, the bias voltage Vbias1 is applied to the gate electrode of the gain transistor 6a via the selection resistor 14a accordingly, the gain transistor 6a is turned on to amplify the input RF signal $RF_{in1}$, the driving transistor 22a is turned off by the control voltage Vctrl1, and the driving transistor 22b is turned on by the control voltage Vctrl2, such that the amplified RF signal is transmitted to the load circuit 24b through the driving transistor 22b, and operates with the load inductor 34b to generate an output RF signal RFout2.

Further, the grounding switch 12b is opened, the bypass switches 146c and 146d are opened, the power source switch 10b is closed, the bias voltage Vbias2 is applied to the gate electrode of the gain transistor 6b via the selection resistor 14b, the gain transistor 6b is turned on to amplify the input RF signal $RF_{in2}$, the driving transistor 22c is turned off by the control voltage Vctrl3 and the driving transistor 22d is turned on by the control voltage Vctrl4, such that the amplified RF signal is transmitted to the load circuit 24a through the driving transistor 22d, and operates with the load inductor 34a to generate an output RF signal RFout1.

FIG. 8B is merely a non-exclusive operation example of the first operation mode of the sixth low noise amplifier 45. Specifically, in the first operation mode of the sixth low noise amplifier 45, all the bypass circuits are controlled to be turned off through the control signal generation circuit, and the amplification switch selection circuits are arranged and the driving circuits are controlled to be turned on and turned off, such that one or more RF input signals are amplified through the gain stage circuits, the amplified RF signals are transmitted to the load circuits through the driving circuits and operate with the load circuits to generate and output one or more RF output signals.

Figure 9A:
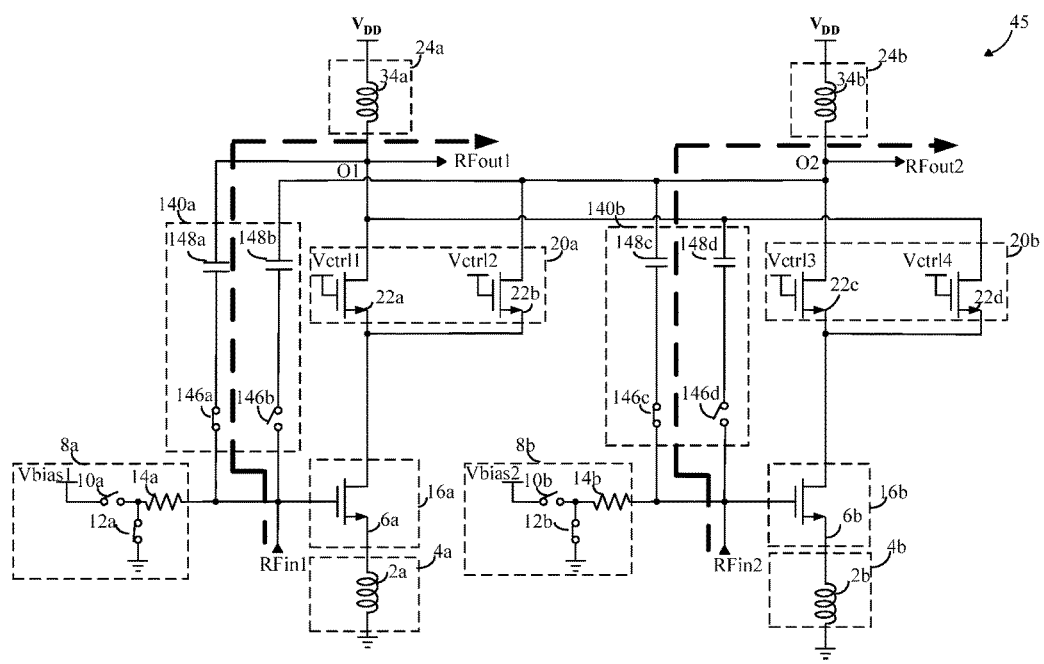
FIGS. 9A and 9B are diagrams showing two example operations of a second operation mode of the low noise amplifier shown in FIG. 7.

FIG. 9A is a diagram showing an example of the second operation mode of the sixth low noise amplifier 45 in FIG. 7. As shown in FIG. 9A, during the specific implementation, the grounding switch 12a is closed, the power source switch 10a is opened, the bypass switch 146a is closed, and the bypass switch 146b is opened, such that the gate electrode of the gain transistor 6a is grounded through the selection resistor 14a, the gain transistor 6a is turned off, the bypass coupling capacitor 148a is enabled to transmit the input RF signal $RF_{in1}$, and the transmitted RF signal operates with the load circuit 24a to generate the output RF signal RFout1.

Further, the grounding switch 12b is closed, the power source switch 10b is opened, the bypass switch 146c is closed, and the bypass switch 146d is opened, such that the gate electrode of the gain transistor 6b is grounded through the selection resistor 14b, the gain transistor 6b is turned off, the bypass coupling capacitor 148c is enabled to transmit the input RF signal $RF_{in2}$ and the transmitted RF signal operates with the load circuit 24b to generate the output RF signal RFout2.

FIG. 9A is merely a non-exclusive operation example of the second operation mode of the sixth low noise amplifier 45. Specifically, in the second operation mode of the sixth low noise amplifier 45, the amplification switch selection circuits are configured through the control signal generation circuit to turn off all the gain transistors of the plurality of gain stage circuits; and the bypass switches of the bypass circuits are controlled to opened and closed, so that one or more RF input signals are outputted to the load circuits through the bypass coupling capacitors and then operate with the load circuits to generate one or more RF output signals.

Figure 9B:
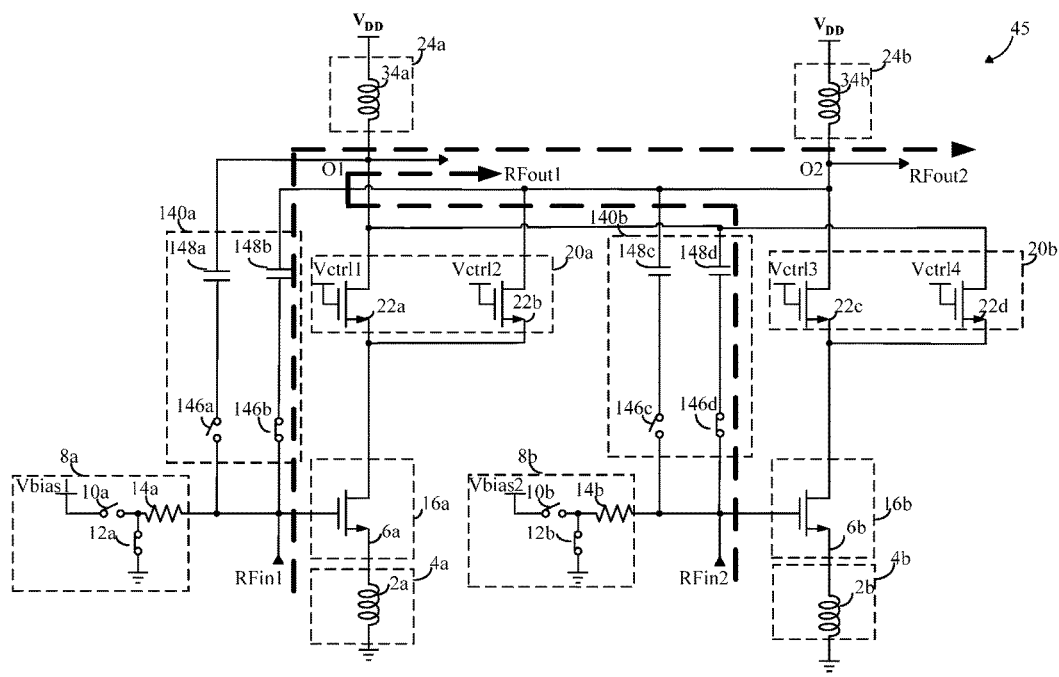

FIG. 9B is a diagram showing another example of the second operation mode of the sixth low noise amplifier 45 in FIG. 7. As shown in FIG. 9B, during the specific implementation, the grounding switch 12a is closed, the power source switch 10a is opened, the bypass switch 146a is opened, and the bypass switch 146b is closed, such that the gate electrode of the gain transistor 6a is grounded through the selection resistor 14a, the gain transistor 6a is turned off, so that the bypass coupling capacitor 148b is enabled to transmit the input RF signal $RF_{in1}$, and the transmitted RF signal operates with the load circuit 24b to generate the output RF signal RFout2.

Further, the grounding switch 12b is closed, the power source switch 10b is opened, the bypass switch 146c is opened, and the bypass switch 146d is closed, such that the gate electrode of the gain transistor 6b is grounded through the selection resistor 14b, the gain transistor 6b is turned off, so that the bypass coupling capacitor 148d is enabled to transmit the input RF signal $RF_{in2}$, and the transmitted RF signal operates with the load circuit 24a to generate the output RF signal RFout1.

FIG. 9B is merely a non-exclusive operation example of the second operation mode of the sixth low noise amplifier 45. Specifically, the second operation mode of the sixth low noise amplifier 45 further includes: the amplification switch selection circuits are configured through the control signal generation circuit, to turn off all the gain transistors of the plurality of gain stage circuits; and the bypass switches of the bypass circuits are controlled to opened and closed, so that one or more RF input signals are outputted to the load circuits through the bypass coupling capacitors and then operate with the load circuits to generate one or more RF output signals.

Figure 10A:
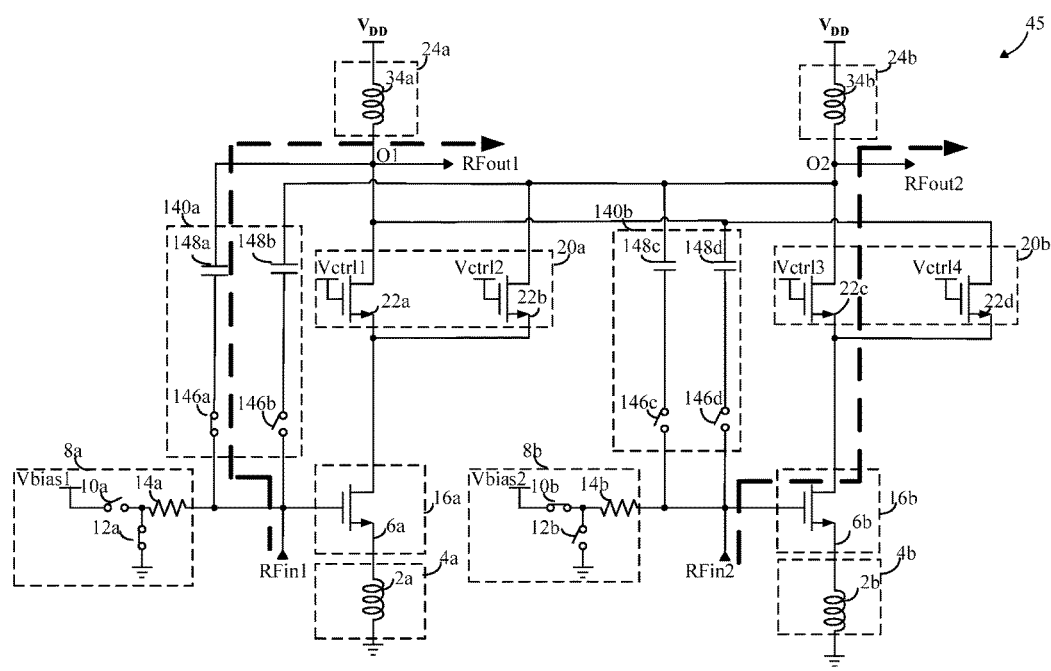
FIGS. 10A and 10B are diagrams showing two example operations of a third operation mode of the low noise amplifier shown in FIG. 7.

FIG. 10A is a diagram showing an example of the third operation mode of the sixth low noise amplifier 45 in FIG.

7. As shown in FIG. 10A, during the specific implementation, the grounding switch 12a is closed, the power switch 10a is opened, the bypass switch 146a is closed, and the bypass switch 146b is opened, such that the gate electrode of the gain transistor 6a is grounded through the selection resistor 14a, the gain transistor 6a is turned off, the bypass coupling capacitor 148a is enabled to transmit the input RF signal $RF_{in1}$, and the transmitted RF signal operates with the load circuit 24a to generate the output RF signal RFout1.

Further, the grounding switch 12b is opened, the power source switch 10b is closed, the bypass switch 146c is opened, and the bypass switch 146d is opened, the bias voltage Vbias2 is applied to the gate electrode of the gain transistor 6b via the selection resistor 14b, the gain transistor 6b is turned on to amplify the input RF signal $RF_{in2}$, the driving transistor 22c is turned on by the control voltage Vctrl3, the driving transistor 22d is turned off by the control voltage Vctrl4, such that the amplified RF signal is transmitted to the load circuit 24b via the driving transistor 22c and operates with the load circuit 24b to generate the output RF signal RFout2.

FIG. 10A is merely a non-exclusive operation example of the third operation mode of the sixth low noise amplifier 45. Specifically, in the third operation mode of the sixth low noise amplifier 45, the amplification switch selection circuits are configured through the control signal generation circuit to turn on one or more gain transistors of the plurality of gain stage circuits; and the driving transistors and the bypass switches of the bypass circuits are controlled to opened and closed, such that one or more RF input signals are outputted to the load circuits via the bypass coupling capacitors, and at this time, other one or more RF input signals are amplified through the gain stage circuits and the driving transistors and are outputted to the load circuits, the one or more RF input signals and the other one or more RF input signals operate with the load circuits to generate multiple RF output signals.

Figure 10B:
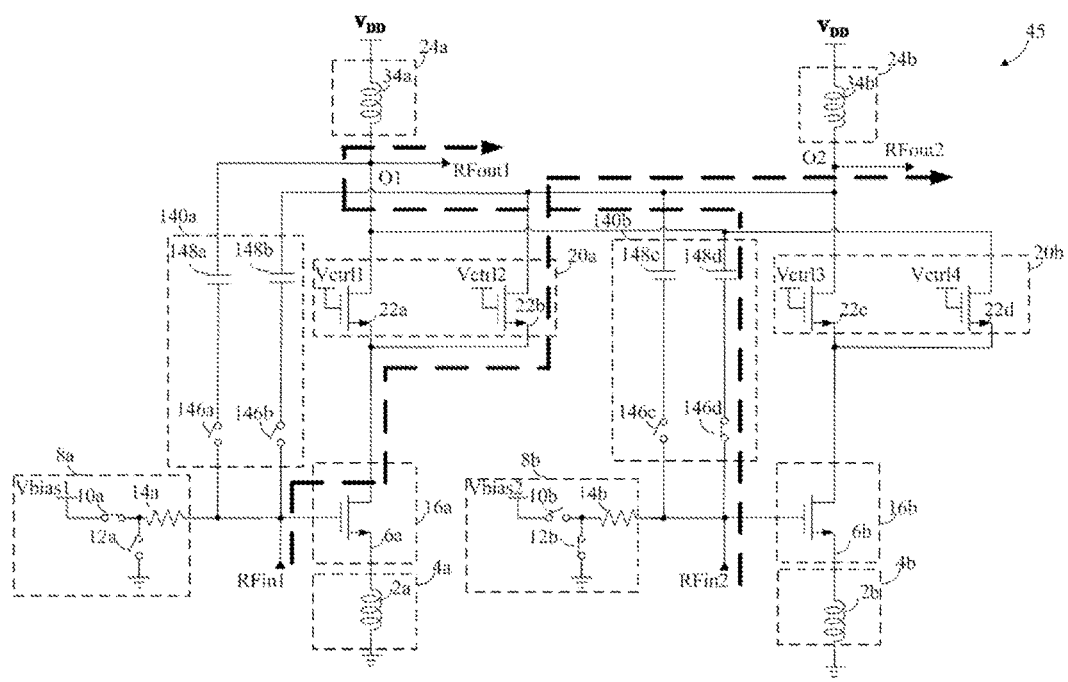

FIG. 10B is a diagram showing merely another example of the third operation mode of the sixth low noise amplifier in FIG. 7. As shown in FIG. 10B, during the specific implementation, the grounding switch 12a is opened, the power switch 10a is closed, the bypass switch 146a is opened, and the bypass switch 146b is opened, such that the bias voltage Vbias1 is applied to the gate electrode of the gain transistor 6a through the selection resistor 14a, the gain transistor 6a is turned on to amplify the RF input signal $RF_{in1}$, the driving transistor 22a is turned off by the control voltage Vctrl1, the driving transistor 22b is turned on by the control voltage Vctrl2, such that the RF signal amplified by the gain transistor 6a is transmitted to the load circuit 24b via the driving transistor 22b and operates with the load inductor 34b to generate the RF output signal RFout2.

Further, the grounding switch 12b is closed, the power source switch 10b is opened, the bypass switch 146c is opened, the bypass switch 146d is closed, the gate electrode of the gain transistor 6b is connected to the ground via the selection resistor 14b, the gain transistor 6b is turned off, so that the bypass coupling capacitor 148d is enabled to transmit the input RF signal $RF_{in2}$, and the transmitted RF signal operates with the load circuit 24a to generate the output RF signal RFout1.

FIG. 10B is merely a non-exclusive operation example of the third operation mode of the sixth low noise amplifier 45. Specifically, in the third operation mode of the sixth low noise amplifier 45, the amplification switch selection circuits are configured through the control signal generation circuit to turn on one or more gain transistors of the plurality of gain stage circuits; and the driving transistors and the bypass switches of the bypass circuits are controlled to opened and closed, such that one or more RF input signals are outputted to the load circuits via the bypass coupling capacitors, and at this time, other one or more RF input signals are amplified by the gain stage circuits and the driving transistors and are outputted to the load circuits. The one or more RF input signals and the other one or more RF input signals operate with the load circuits to generate multiple RF output signals.

Figure 11A:
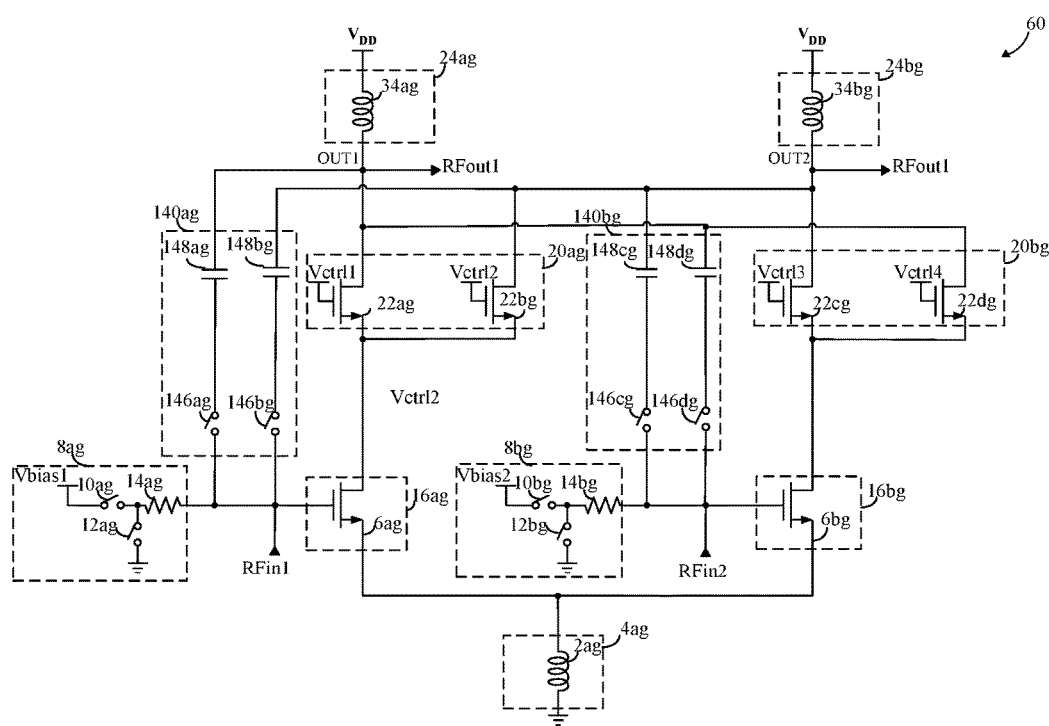
FIG. 11A is a schematic circuit diagram of another low noise amplifier according to an embodiment of the present disclosure.

FIG. 11A is a schematic circuit diagram of another low noise amplifier according to an embodiment of the present disclosure. As shown in FIG. 11A, functions of an amplification selection switching circuit 8ag, an amplification selection switching circuit 8bg, a bypass circuit 140ag, a bypass circuit 140bg, a driving circuit 20ag, a driving circuit 20bg, a load circuit 24ag and a load circuit 24bg of a seventh low noise amplifier 60 are same with functions of the amplification selection switching circuit 8a, the amplification selection switching circuit 8b, the bypass circuit 140a, the bypass circuit 140b, the driving circuit 20a, the driving circuit 20b, the load circuit 24a and the load circuit 24b of the sixth low noise amplifier 45 in FIG. 7, respectively. The difference lies in that, in the sixth low noise amplifier 45 in FIG. 7, the source electrode of the gain transistor 6a is connected to the coupling inductor 2a, and the gain transistor 6b is connected to the coupling inductor 2b, but in the seventh low noise amplifier 60 shown in FIG. 11A, a source electrode of a gain transistor 6ag and a source electrode of a gain transistor 6bg are connected together to a coupling inductor 2ag. Operation modes of the seventh low noise amplifier 60 are the same as the operation modes of the sixth low noise amplifier 45, and the specific operation process is not repeated here. The gain transistor 6ag and the gain transistor 6bg share the coupling inductor 2ag. Therefore, on the premise of achieving the same circuit function, the circuit area is further reduced.

Figure 11B:
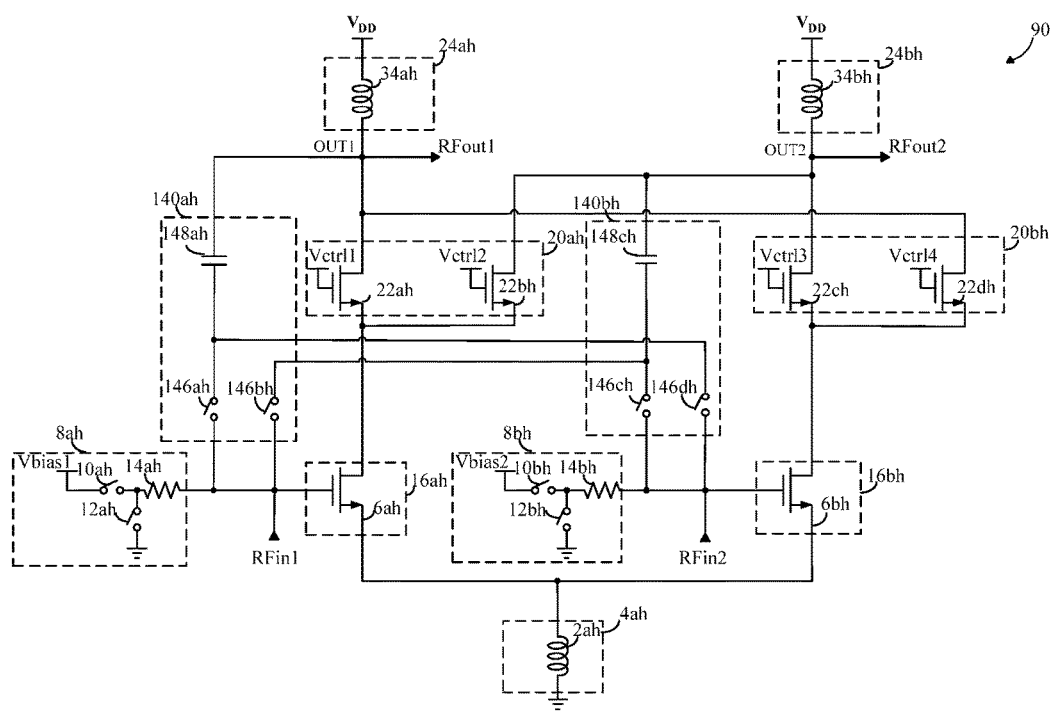
FIG. 11B is a schematic circuit diagram of another low noise amplifier according to an embodiment of the present disclosure.

FIG. 11B is a schematic circuit diagram of another low noise amplifier according to an embodiment of the present disclosure. As shown in FIG. 11B, in an eighth low noise amplifier 90 shown in FIG. 11B, one terminal of a bypass switch 146bh is connected to the RF input signal terminal, and the other terminal of the bypass switch 146bh is connected to a common terminal of a bypass coupling capacitor 148ch and a bypass switch 146ch. One terminal of a bypass switch 146dh of the eighth low noise amplifier 90 is connected to the RF input signal terminal, and the other terminal of the bypass switch 146dh is connected to a common terminal of a bypass coupling capacitor 148ah and a bypass switch 146ah. A bypass branch of the bypass switch 140ah and a bypass branch of the bypass switch 140bh share the bypass coupling capacitor 148ah and the bypass coupling capacitor 148ch.

In the sixth low noise amplifier 45 in FIG. 7, one terminal of the bypass switch 146b is connected to the RF input signal $RF_{in1}$, the other terminal of the bypass switch 146b is connected to one terminal of the bypass coupling capacitor 148b, and the other terminal of the bypass coupling capacitor 148b is connected to the RF output terminal O2. One terminal of the bypass switch 146d is connected to the RF input signal $RF_{in2}$, the other terminal of the bypass switch 146d is connected to one terminal of the bypass coupling capacitor 148d, and the other terminal of the bypass coupling capacitor 148d is connected to the RF output terminal O1. Compared to the low noise amplifier 15 shown in FIG. 7, the low noise amplifier 90 provided by this embodiment can reduce the number of bypass coupling capacitors.

Operation modes of the eighth low noise amplifier 90 are the same as the operation modes of the sixth low noise amplifier 45, and the specific operation process is not repeated here.

Figure 11C:
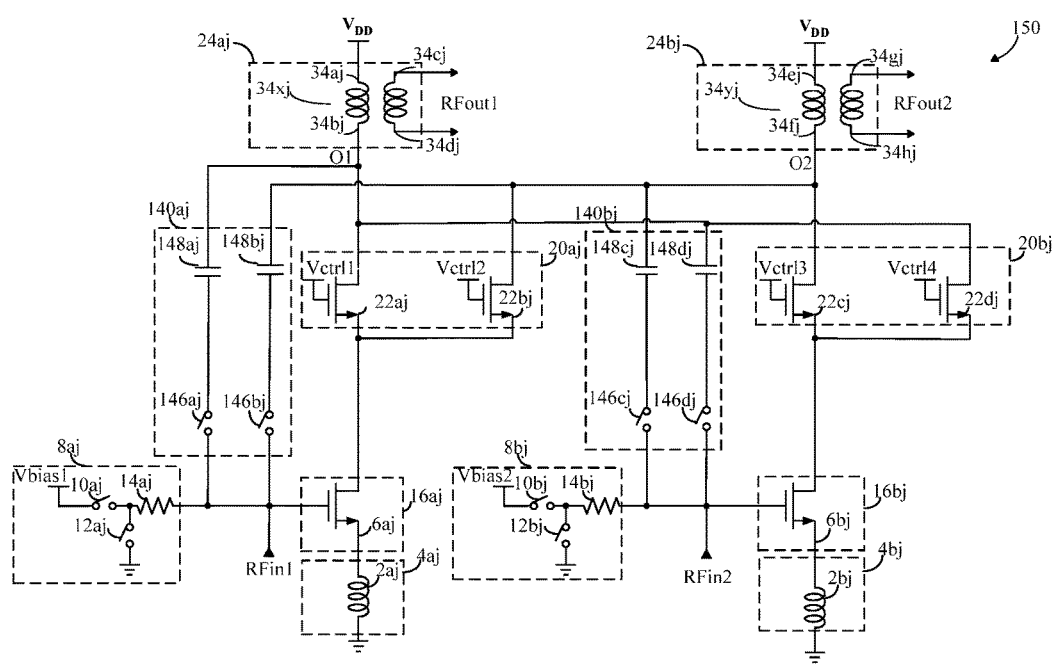
FIG. 11C is a schematic circuit diagram of another low noise amplifier according to an embodiment of the present disclosure.

FIG. 11C is a schematic circuit diagram of another low noise amplifier according to an embodiment of the present disclosure. As shown in FIG. 11C, unlike the low noise amplifier shown in FIG. 7, a load circuit 24aj employs a balun 34xj, and a load circuit 24bj employs a balun 34yj. An unbalanced terminal 34ej of the balun 34yj is connected to the power source voltage VDD, and another unbalanced terminal 34fj of the balun 34yj, a drain electrode of a driving transistor 22cj, a drain electrode of a driving transistor 22bj, a bypass coupling capacitor 148bj of a bypass circuit 140aj and a bypass coupling capacitor 148cj of a bypass circuit 140bj are connected to each other. A balanced terminal 34 gj and a balanced terminal 34hj of the balun 34yj are configured to function as the RF output terminal.

In addition, the load circuit 24aj and the load circuit 24bj may further include one or more of a load capacitor, a load resistor and a balun transistor to provide an active load. The frequency responses of the load circuit 24aj and the load circuit 24bj may be narrowband or wideband.

Functions of an amplification selection switching circuit 8aj, an amplification selection switching circuit 8bj, a bypass circuit 140aj, a bypass circuit 140bj, a driving circuit 20aj, a driving circuit 20bj, the load circuit 24aj and the load circuit 24bj of a ninth low noise amplifier 150 are same with functions of the amplification selection switching circuit 8a, the amplification selection switching circuit 8b, the bypass circuit 140a, the bypass circuit 140b, the driving circuit 20a, the driving circuit 20b, the load circuit 24a and the load circuit 24b of the sixth low noise amplifier 45 in FIG. 7, respectively. The difference lie in that, the load circuit 24aj of the ninth low noise amplifier shown in FIG. 11B employs the balun, but the load circuit 24a of the sixth low noise amplifier shown in FIG. 7 employs the load inductor. The specific operation process is not repeated here.

Figure 12:
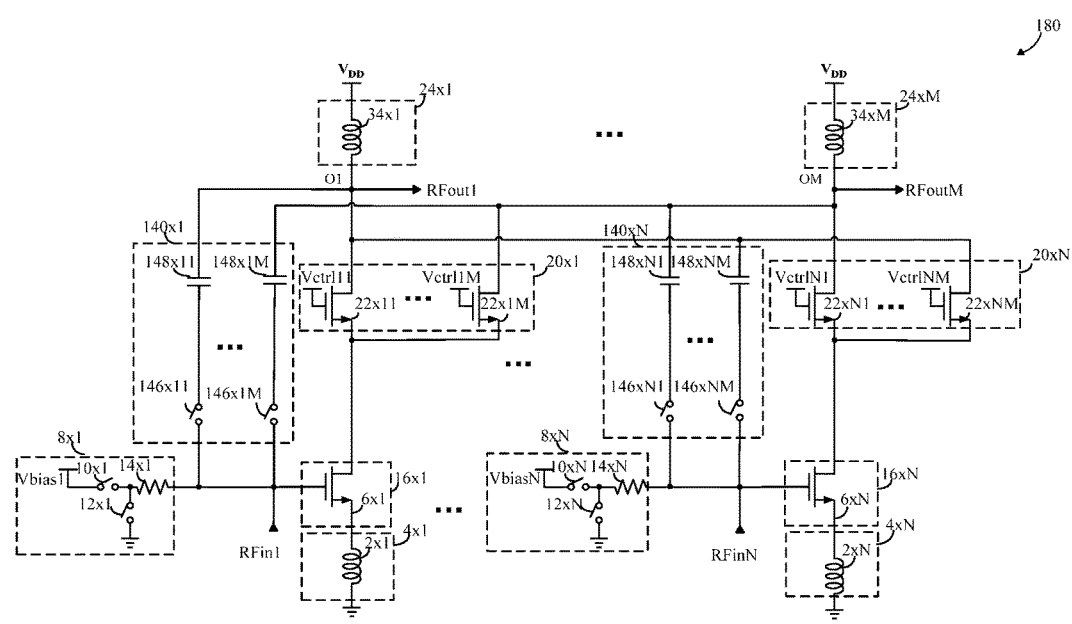
FIG. 12 is a schematic circuit diagram of another low noise amplifier according to an embodiment of the present disclosure.

FIG. 12 is a schematic circuit diagram of another low noise amplifier according to an embodiment of the present disclosure. FIG. 12 illustrates an exemplarily design of a N–(N≥2) input M (M≥1) output low noise amplifier with switches and bypass branches. As shown in FIG. 12, a tenth low noise amplifier 180 includes N bypass circuits (bypass circuits 140x1 to 140xN), N amplification selection switching circuits (amplification selection switching circuits 8x1 to 8xN), N gain stage circuits (gain stage circuits 16x1 to 16xN), N driving circuits (driving circuits 20x1 to 20xN), M load circuits (load circuits 24x1 to 24xM), and N coupling circuits (coupling circuits 4x1 to 4xN). The tenth low noise amplifier 180 can amplify and/or directly transmit one or more of N input RF signals $RF_{in1}$ to $RF_{inN}$ and output them from one or more of M RF signal output terminals O1 to OM.

FIG. 12 briefly illustrates the connection manner of the tenth low noise amplifier. In FIG. 12, merely illustrated are the partial specific connections of the bypass circuit 140x1, the bypass circuit 140xN, the amplification selection switching circuit 8x1, the amplification selection switching circuit 8xN, the gain stage circuit 16x1, the gain stage circuit 16xN, the driving circuit 20x1, the driving circuit 20xN, the load circuit 24x1, the load circuit 24xM, the coupling circuit 4x1 and the coupling circuit 4xN.

Specifically, the coupling circuit 4x1 includes a coupling inductor 2x1 used for source electrode negative feedback; the coupling circuit 4xN includes a coupling inductor 2xN used for source electrode negative feedback; the gain stage circuit 16x1 includes a gain transistor 6x1; and the gain stage circuit 16xN includes a gain transistor 6xN. The gain transistors may employ various types of transistors. In this embodiment, the gain transistor 6x1 and the gain transistor 6xN employ the NMOS transistors. A source electrode of the gain transistor 6x1 is connected to one terminal of the coupling inductor 2x1, and the other terminal of the coupling inductor 2x1 is grounded. A source electrode of the gain transistor 6xN is connected to one terminal of the coupling inductor 2xN, and the other terminal of the coupling inductor 2xN is grounded. In one or more embodiments, the source electrode of the gain transistor 6x1 and the source electrode of the gain transistor 6xN may be directly grounded, or be grounded via coupling inductors.

The driving circuit 20x1 includes M driving transistors 22x11 to 22x1M. The driving circuit 20xN includes M driving transistors 22xN1 to 22xNM. These driving transistors may employ various types of transistors. In this embodiment, these driving transistors are NMOS transistors. A gate electrode of the driving transistor 22x11 is connected to a control voltage Vctrl11. A gate electrode of the driving transistor 22x1M is connected to a control voltage Vctrl1M. A gate electrode of the driving transistor 22xN1 is connected to a control voltage VctrlN1. A gate electrode of the driving transistor 22xNM is connected to a control voltage VctrlNM. A source electrode of the driving transistor 22x11 is connected to a source electrode of the driving transistor 22x1M and a drain electrode of the gain transistor 6x1. A source electrode of the driving transistor 22xN1 is connected to a source electrode of the driving transistor 22xNM and a drain electrode of the gain transistor 6xN. The magnitudes of the M control voltages Vctrl11 to Vctrl1M and M control voltages VctrlN1 to VctrlNM are generated by the control signal generation circuit, which can be designed by those skilled in the art and are not described here again.

The load circuit 24x1 includes a load inductor 34x1. The load circuit 24xN includes a load inductor 34xN. One terminal of the load inductor 34x1 is connected to the power source voltage VDD. The other terminal of the load inductor 34x1, the drain electrode of the driving transistor 22x11, the drain electrode of the driving transistor 22xNM, a bypass coupling capacitor 148x11 of the bypass circuit 140x1 and a bypass coupling capacitor 148xNM of the bypass circuit 140xN are connected to each other to form a RF signal output terminal O1. One terminal of a load inductor 34xM is connected to the power source voltage VDD. The other terminal of the load inductor 34xM, the drain electrode of the driving transistor 22xN1, the drain electrode of the driving transistor 22x1M, a bypass coupling capacitor 148x1M of the bypass circuit 140x1 and a bypass coupling capacitor 148xN1 of the bypass circuit 140xN are connected to each other to form a RF signal output terminal OM. Moreover, the M load circuits 24x1 to 24xM may further include one or more of a load capacitor, a load resistor and a balun transistor to provide an active load. The frequency responses of the M load circuits 24x1 to 24xM may be narrowband or wideband.

The amplification selection switching circuit 8x1 includes a power source switch 10x1, a grounding switch 12x1, a grounding switch 12x1 and a selection resistor 14x1. One terminal of the power source switch 10x1 is connected to a bias voltage Vbias1, and the other terminal of the power source switch 10x1 is connected to one terminal of the selection resistor 14x1 and the grounding switch 12x1. The other terminal of the grounding switch 12x1 is grounded. The other terminal of the selection resistor 14x1 is connected to the gate electrode of the gain transistor 6x1 and one terminal of the bypass switch 146x11 and one terminal of the bypass switch 146x1M of the bypass circuit 140x1. The other terminal of the bypass switch 146x11 is connected to one terminal of the bypass coupling capacitor 148x11, and the other terminal of the bypass coupling capacitor 148x11 is connected to the RF output terminal O1. The other terminal of the bypass switch 146x1M is connected to one terminal of the bypass coupling capacitor 148x1M, and the other terminal of the bypass coupling capacitor 148x1M is connected to the RF output terminal OM. One terminal of the power source switch 10xN is connected to a bias voltage VbiasN, and the other terminal of the power source switch 10xN is connected to one terminal of a selection resistor 14xN and a grounding switch 12xN. The other terminal of the grounding switch 12xN is grounded. The other terminal of the selection resistor 14xN is connected to the gate electrode of the gain transistor 6xN and one terminal of the bypass switch 146xN1 and one terminal of the bypass switch 146xNM of the bypass circuit 140xN. The other terminal of the bypass switch 146xN1 is connected to one terminal of the bypass coupling capacitor 148xN1, and the other terminal of the bypass coupling capacitor 148xN1 is connected to the RF output terminal OM. The other terminal of the bypass switch 146xNM is connected to one terminal of the bypass coupling capacitor 148xNM, and the other terminal of the bypass coupling capacitor 148xNM is connected to the RF output terminal O1. The opened/closed states of the power source switches, the grounding switches, the bypass coupling switches and the bypass coupling switch are controlled by the control signal generation circuit. The frequencies or frequency bands of the N RF signals $RF_{in1}$ to $RF_{inN}$ to be amplified may be the same or different.

Functions of the amplification selection switching circuit 8x1, the amplification selection switching circuit 8xN, the bypass circuit 140x1, the bypass circuit 140xN, the driving circuit 20x1, the driving circuit 20xN, the load circuit 24x1 and the load circuit 24xM, the gain stage circuit 16x1, the gain stage circuit 16xN, the coupling circuit 4x1 and the coupling circuit 4xN of the tenth low noise amplifier 180 are same with functions of the amplification selection switching circuit 8a, the amplification selection switching circuit 8b, the bypass circuit 140a, the bypass circuit 140b, the driving circuit 20a, the driving circuit 20b, the load circuit 24a and the load circuit 24b of the sixth low noise amplifier 45 in FIG. 7, respectively. The sixth low noise amplifier 45 in FIG. 7 is a specific example of the tenth low noise amplifier 180 in FIG. 12, in which N=2 and M=2. The specific operation process is not described again.

Embodiments of the present disclosure further provide a radio frequency amplification method using the low noise amplifier. The low noise amplifier includes: a plurality of gain stage circuits, the number of which is equal to or greater than the number of RF signals to be amplified, and which are configured to independently amplify the RF signal when being enabled; a plurality of amplification selection switching circuits connected to the plurality of gain stage circuits and configured to, according to the RF signal, select the gain stage circuit and select the enabled gain stage circuit; a plurality of driving circuits connected to the plurality of gain stage circuits and configured to, when the gain stage circuit is enabled, receive at least one RF signal amplified by the gain stage circuit and output the amplified RF signal; and at least one load circuit, which is connected with the driving circuit and configured for outputting at least one RF output signal according to the amplified RF signal outputted by the driving circuit. The bypass circuit includes an input terminal and an output terminal. The gain stage circuit includes an input terminal and a first terminal. The driving circuit includes an input terminal and an output terminal. Each of the plurality of amplification selection switching circuits is connected to the input terminal of the respective one of the plurality of gain stage circuits. The input terminal of driving circuit is connected to the first terminal of the gain stage circuit, and the load circuit is connected to the output terminal of the driving circuit.

The input terminal of the bypass circuit is connected to the input terminal of a respective gain stage circuit, and the output terminal of the bypass circuit is connected to at least one load circuit. The bypass circuit is configured to, when being enabled, transmit the RF signal inputted by the input terminal of the gain stage circuit connected thereto to the load circuit.

Figure 13A:
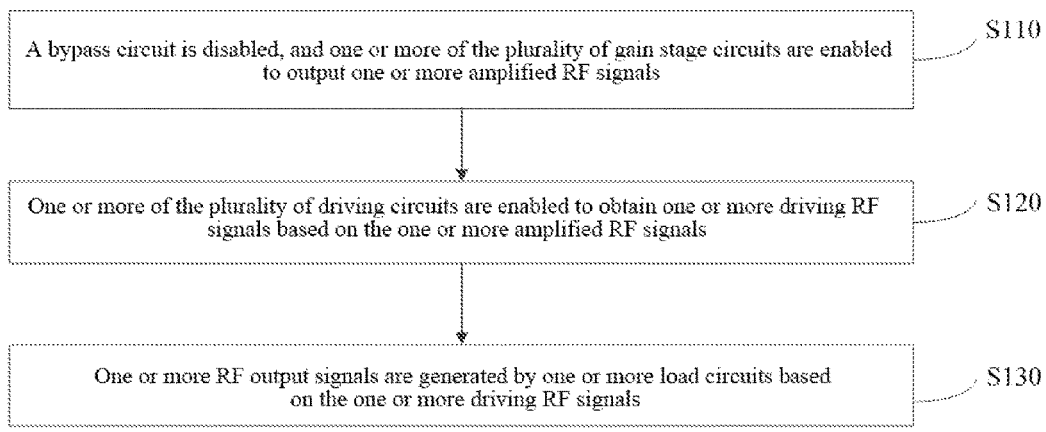
FIG. 13A is a schematic flowchart of a radio frequency amplification method using the low noise amplifier according to an embodiment of the present disclosure.

As shown in FIG. 13A, the method includes steps S110 to S130.

In step S110, the bypass circuits is disabled and one or more of the plurality of gain stage circuits are enabled so as to output one or more amplified RF signals.

In step S120, one or more of the plurality of driving circuits are enabled to obtain one or more driving RF signals based on the one or more amplified RF signals.

In step S130, one or more RF output signals are generated by one or more load circuits based on the one or more driving RF signals.

Figure 13B:
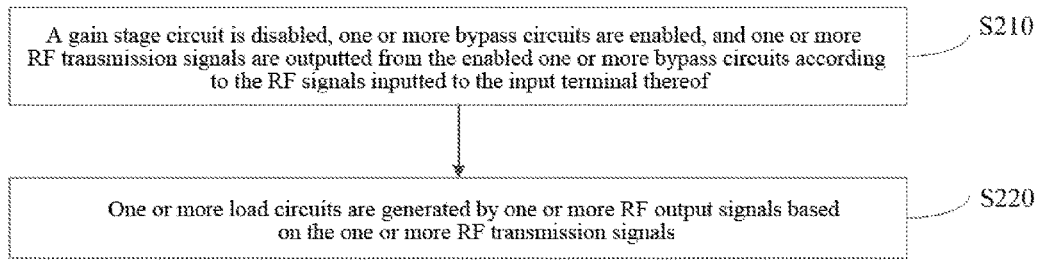
FIG. 13B is a schematic flowchart of a radio frequency amplification method using the low noise amplifier according to an embodiment of the present disclosure.

Embodiments of the present disclosure further provide another radio frequency amplification method using the low noise amplifier. As shown in FIG. 13B, the method includes steps S210 and S220.

In step S210, the gain stage circuits are disabled, one or more bypass circuits are enabled, one or more RF transmission signals are outputted by the enabled one or more bypass circuits according to the RF signals inputted to the input terminal.

In step S220, one or more RF output signals are generated by one or more of the plurality of load circuits based on the one or more RF transmission signals.

Figure 13C:
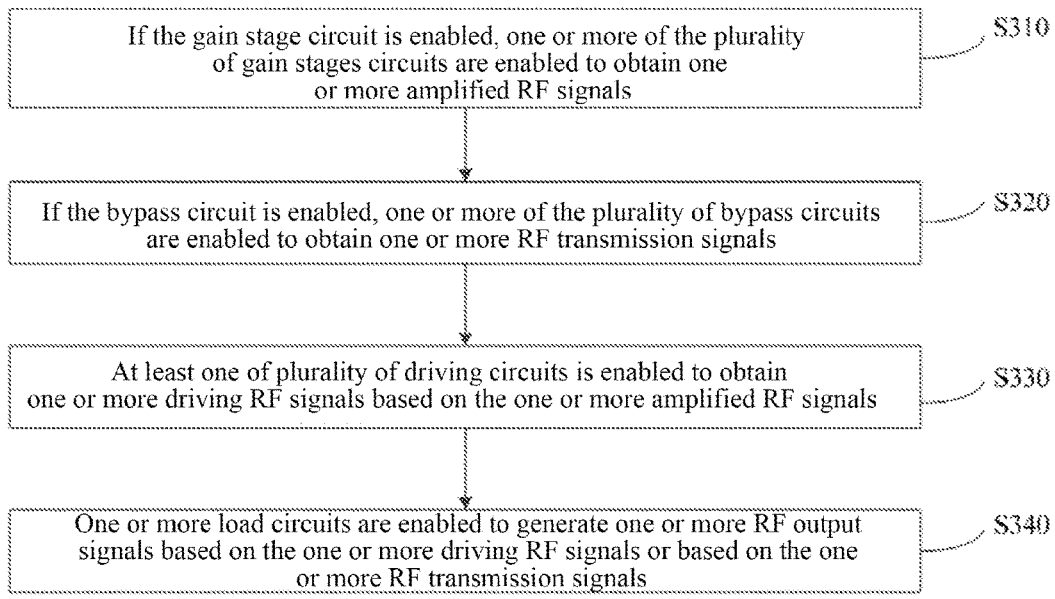
FIG. 13C is a schematic flowchart of a radio frequency amplification method using the low noise amplifier according to an embodiment of the present disclosure.

Embodiments of the present disclosure further provide another radio frequency amplification method using the low noise amplifier. As shown in FIG. 13C, the method includes steps S310 and S340.

In step S310, if the gain stage circuit is enabled, one or more of the plurality of gain stages circuits are enabled to obtain one or more amplified RF signals.

In step S320, if the bypass circuit is enabled, one or more of the plurality of bypass circuits are enabled to obtain one or more RF transmission signals.

In step S330, at least one of plurality of driving circuits is enabled to obtain one or more driving RF signals based on the one or more amplified RF signals.

In step S340, one or more load circuits are enabled to generate one or more RF output signals based on the one or more driving RF signals or based on the one or more RF transmission signals.

In each RF amplification method, one or more of the plurality of gain stage circuits are selected to be enabled or disabled (that is, the gain stage circuits are not enabled) by using the amplification selection switching circuits connected to the plurality of gain stage circuits and according to the RF signals to be amplified.

One or more of the plurality of bypass circuits are selected to be enabled or disabled (that is, the gain stage circuits are not enabled) by using the bypass selection switches in the bypass circuits and according to the RF signals to be amplified.

The RF amplification method using the low noise amplifier provided by embodiments of the present disclosure is applicable to the low noise amplifier provided by any embodiment of the present disclosure.

The multiple-input multiple-output (MIMO) low noise amplifier (LNA) with switch and bypass functions described in embodiments of the present disclosure mainly includes amplification selection switching circuits, coupling circuits, gain stage circuits, driving circuits, load circuits and bypass circuits. Each of the above parts is described in at least one configuration, so that a variety of possible circuit structures may be obtained. These circuit structures should all be included in the protection scope of the present disclosure, rather than intended to limit the present disclosure.

The low noise amplifier with switch and bypass functions described in embodiments of the present disclosure may be implemented by means of IC, RFIC, analog-digital mixed-mode IC and ASIC and so on. The manufacturing process can be CMOS, CMOS SOI, SiGe, GaAs, pHEMT, HBT, BJT, BiCMOS, and the like.

It should be noted that the foregoing are only the preferred embodiments of the present disclosure and the applied technical principles. Those skilled in the art should understand that the present disclosure is not limited to the specific embodiments described herein, and various apparent changes, readjustments and substitutions made by those skilled in the art are not departed from the scope of the present disclosure. Therefore, although the present disclosure has been described in detail by way of the above embodiments, the present disclosure is not limited to the above embodiments. More other equivalent embodiments may be included without departing from the concept of the present disclosure. However, the scope of the present disclosure is determined by the scope of the appended claims.

What is claimed is:

1. A low noise amplifier comprising:
a plurality of gain stage circuits, wherein the number of the plurality of gain stage circuits is equal to or greater than the number of radio frequency (RF) signals to be amplified, and each of the gain stage circuits is configured to, when being enabled, individually amplify a RF signal;
a plurality of amplification selection switching circuits, wherein each of the plurality of amplification selection switching circuits is connected to a respective one of the plurality of gain stage circuits and is configured to, control based on the RF signal, the respective gain stage circuit to be enabled or disabled;
a plurality of driving circuits, wherein each of the plurality of driving circuits is connected to a respective one of the plurality of gain stage circuits and is configured to, when the gain stage circuit is enabled, receive at least one RF signal amplified by the gain stage circuit and output the amplified RF signal; and
at least one load circuit, wherein the at least one load circuit is connected to the plurality of driving circuits and is configured to output at least one radio frequency (RF) output signal according to the amplified RF signal outputted by the driving circuit,
wherein the plurality of amplification selection switching circuits are connected to the plurality of gain stage circuits in one-to-one correspondence,
wherein each of the amplification selection switching circuits comprises a power source switch, a selection resistor and an grounding switch, and
wherein one terminal of the power source switch is supplied with a bias voltage, the other terminal of the power source switch is connected to one terminal of the grounding switch and connected to the respective one of the gain stage circuits via the selection resistor, and the other terminal of the grounding switch is grounded.

2. The low noise amplifier according to claim 1, wherein each of the plurality of gain stage circuits comprises an input terminal and a first terminal, each of the plurality of driving circuits comprises an input terminal and an output terminal, and each of the plurality of amplification selection switching circuits is connected to the input terminal of the respective one of the plurality of gain stage circuits,
wherein the input terminals of the driving circuits are connected to the first terminal of the gain stage circuits, the at least one load circuit is connected to the output terminals of the driving circuits,
wherein the low noise amplifier further comprises at least one bypass circuit having an input terminal and an output terminal, the input terminal of the at least one bypass circuit is connected to the input terminals of the gain stage circuits and the output terminal of the at least one bypass circuit is connected to the at least one load circuit,
wherein the at least one bypass circuit is configured to output when being enabled, a radio frequency (RF) transmission signal to the at least one load circuit connected to the bypass circuit based on the RF signal inputted to the input terminal of the bypass circuit, and
wherein the at least one load circuit is further configured to receive the RF transmission signal transmitted by the bypass circuit and provide at least one RF output signal according to the RF transmission signal.

3. The low noise amplifier according to claim 2, wherein each of the plurality of gain stage circuits comprises an amplifier circuit, the amplifier circuit comprises a gain transistor, the RF signal is applied to a control electrode of the gain transistor, the control electrode of the gain transistor is connected to the respective one of the amplification selection switching circuits and the input terminal of the at least one bypass circuit, and a drain electrode of the gain transistor is connected to one of the driving circuits.

4. The low noise amplifier according to claim 1, further comprising at least one coupling circuit, wherein each of the gain stage circuits further comprises a second terminal, and the second terminal of each of the gain stage circuits is connected to the at least one coupling circuit which is grounded.

5. The low noise amplifier according to claim 4, wherein at least two of the plurality of gain stage circuits share the at least one coupling circuit, wherein the second terminals of at least two gain stage circuits are both connected to the at least one coupling circuit.

6. The low noise amplifier according to claim 5, wherein the at least one coupling circuit comprises a coupling inductor, one terminal of the coupling inductor is connected to the second terminals of the gain stage circuits and the other terminal of the coupling inductor is grounded.

7. The low noise amplifier according to claim 1, wherein each of the driving circuits comprises at least one driving transistor, a first electrode of the at least one driving transistor is connected to the respective one of the gain stage circuits, a second electrode thereof is connected to the at least one load circuit, a control electrode thereof is configured to receive a control voltage, and the at least one driving transistor is enabled or disabled according to the control voltage.

8. The low noise amplifier according to claim 7, wherein each of the driving circuits comprises at least two driving transistors, and different driving transistors in the driving circuit are connected to different load circuits of the at least one load circuit, respectively.

9. The low noise amplifier according to claim 2, wherein the at least one bypass circuit comprises at least one bypass selection switch and at least one bypass coupling capacitor, wherein one terminal of at least one bypass selection switch is connected to the input terminal of the respective one of the gain stage circuits, and the other terminal of at least one bypass selection switch is connected to at least one load circuit via the bypass coupling capacitor.

10. The low noise amplifier according to claim 2, wherein the at least one bypass circuit comprises at least two bypass circuits sharing the at least one bypass coupling capacitor.

11. The low noise amplifier according to claim 10, wherein a different bypass coupling capacitors in each of the at least one bypass circuit are connected to different load circuits of the at least one load circuit, respectively.

12. The low noise amplifier according to claim 2, wherein the bypass circuit comprises one or more of a load inductor, a load capacitor, a load resistor and a balun transistor.

13. The low noise amplifier according to claim 2, wherein the output terminal of one of plurality of gain stage circuits is connected to one of the plurality of driving circuits, the one driving circuit is connected to a plurality of load circuits of the at least one load circuit and the plurality of bypass circuits of the at least one bypass circuit, the RF transmission signal is generated at a connection of the driving circuits with the load circuits and the bypass circuits.

14. The low noise amplifier according to claim 1, further comprising at least one output selection circuit and an output direct current (DC) blocking circuit,
    wherein an input terminal of each of the at least one load circuit is connected to a connection terminal of the load circuit and the driving circuit, an output terminal of each of the at least one load circuit is connected to an input terminal of the output DC blocking circuit, and an output terminal of the output DC blocking circuit functions as an output terminal of the low noise amplifier.

15. The noise amplifier according to claim 14, further comprising at least one bypass circuit,
    wherein the at least one bypass circuit comprises an input terminal and an output terminal, the input terminal of each of the at least one bypass circuit is connected to an input terminal of a respective one of the gain stage circuits, and an output terminal of the at least one bypass circuit is connected to the input terminal of the output DC blocking circuit.

16. The low noise amplifier according to claim 15, wherein the at least one output selection circuit comprises a DC blocking capacitor and an output selection switch, one terminal of the DC blocking capacitor is connected to the connection terminal of the load circuit and the driving circuit, the other terminal of the DC blocking capacitor is connected to one terminal of the output selection switch, the other terminal of the output selection switch is connected to one terminal of an output DC blocking capacitor, and the other terminal of the output DC blocking capacitor is connected to the output terminal of the output DC blocking circuit.

17. A radio frequency amplification method using the low noise amplifier according to claim 1, wherein the low noise amplifier further comprises at least one bypass circuit, the at least one bypass circuit comprises an input terminal and an output terminal, each of the gain stage circuits comprises an input terminal and a first terminal, each of the driving circuit comprises an input terminal and an output terminal, each of the plurality of amplification selection switching circuits is connected to the input terminal of the respective one of the plurality of gain stage circuit, the input terminal of each of the driving circuits is connected to the first terminal of the respective one of the plurality of the gain stage circuits, and the at least one load circuit is connected to the output terminal of the driving circuit,
    wherein the input terminal of the at least one bypass circuit is connected to the input terminal of a respective one of the gain stage circuits, the output terminal of the at least one bypass circuit is connected to the at least one load circuit, the at least one bypass circuit is configured to, when being enabled, transmit the RF signal inputted by the input terminal of the gain stage circuit connected thereto to the load circuit,
    wherein the radio frequency amplification method comprises in a first operation mode;
        disabling the bypass circuit and enabling one or more of the plurality of gain stage circuits to output one or more amplified RF signals;
        enabling one or more of the plurality of driving circuits to obtain one or more driving radio frequency signals based on the one or more amplified RF signals; and
        generating one or more radio frequency output signals by one or more load circuits based on the one or more driving radio frequency signals.

18. A radio frequency amplification method using the low noise amplifier according to claim 1, wherein the low noise amplifier further comprises at least one bypass circuit, the at least one bypass circuit comprises an input terminal and an output terminal, each of the plurality of the gain stage circuits comprises an input terminal and a first terminal, each of the plurality of the driving circuits comprises an input terminal and an output terminal, each of the plurality of amplification selection switching circuits is connected to the input terminal of a respective one of the plurality of gain stage circuits, the input terminals of the driving circuits are connected to the first terminals of the gain stage circuits, and the at least one load circuit is connected to the output terminals of the driving circuits,
    wherein the input terminal of the at least one bypass circuit is connected to the input terminal of a respective one of the gain stage circuits, the output terminal of the at least one bypass circuit is connected to the at least one load circuit, and the at least one bypass circuit is configured to, when being enabled, transmit the RF signal inputted by the input terminal of the gain stage circuit connected thereto to the load circuit,
    wherein the radio frequency amplification method comprises in a second operation mode;
        disabling the gain stage circuits and enabling one or more bypass circuits to output one or more radio frequency transmission signals according to the RF signal inputted to the input terminal of the bypass circuit; and
        generating one or more radio frequency output signals by one or more load circuits based on the one or more radio frequency transmission signals.

19. A radio frequency amplification method using the low noise amplifier according to claim 1, wherein the low noise amplifier further comprises at least one bypass circuit, the bypass circuit comprises an input terminal and an output terminal, each of the gain stage circuits comprises an input terminal and a first terminal, each of the driving circuits comprises an input terminal and an output terminal, each of the plurality of amplification selection switching circuits is connected to the input terminal of a respective one of the plurality of gain stage circuits, the input terminals of the driving circuits are connected to the first terminal of the gain stage circuits, and the at least one load circuit is connected to the output terminals of the driving circuits,
  wherein the input terminal of the at least one bypass circuit is connected to the input terminal of a respective one of the gain stage circuits, the output terminal of the at least one bypass circuit is connected to at least one load circuit, the bypass circuit is configured to, when being enabled, transmit the RF signal inputted by the input terminal of the gain stage circuit connected thereto to the load circuit,
  wherein the radio frequency amplification method comprises:
    enabling, if the gain stage circuit is enabled, one or more of the plurality of gain stage circuits to obtain one or more amplified RF signals;
    enabling at least one of the plurality of driving circuits to obtain one or more driving RF signals based on the one or more amplified RF signals;
    enabling one or more load circuits to generate one or more RF output signals based on the one or more driving RF signals or based on one or more RF transmission signals; and
    enabling, if the bypass circuit is enabled, one or more of the plurality of bypass circuits to obtain one or more RF transmission signals.

20. A low noise amplifier comprising:
  a plurality of gain stage circuits, wherein the number of the plurality of gain stage circuits is equal to or greater than the number of radio frequency (RF) signals to be amplified, and each of the gain stage circuits is configured to, when being enabled, individually amplify a RF signal;
  a plurality of amplification selection switching circuits, wherein each of the plurality of amplification selection switching circuits is connected to a respective one of the plurality of gain stage circuits and is configured to, control based on the RF signal, the respective gain stage circuit to be enabled or disabled;
  a plurality of driving circuits, wherein each of the plurality of driving circuits is connected to a respective one of the plurality of gain stage circuits and is configured to, when the gain stage circuit is enabled, receive at least one RF signal amplified by the gain stage circuit and output the amplified RF signal; and
  at least one load circuit, wherein the at least one load circuit is connected to the plurality of driving circuits and is configured to output at least one radio frequency (RF) output signal according to the amplified RF signal outputted by the driving circuit,
  wherein each of the plurality of gain stage circuits comprises an input terminal and a first terminal, each of the plurality of driving circuits comprises an input terminal and an output terminal, and each of the plurality of amplification selection switching circuits is connected to the input terminal of the respective one of the plurality of gain stage circuits,
  wherein the input terminals of the driving circuits are connected to the first terminal of the gain stage circuits, the at least one load circuit is connected to the output terminals of the driving circuits,
  wherein the low noise amplifier further comprises at least one bypass circuit having an input terminal and an output terminal, the input terminal of the at least one bypass circuit is connected to the input terminals of the gain stage circuits and the output terminal of the at least one bypass circuit is connected to the at least one load circuit,
  wherein the at least one bypass circuit is configured to output when being enabled, a RF transmission signal to the at least one load circuit connected to the bypass circuit based on the RF signal inputted to the input terminal of the bypass circuit, and
  wherein the at least one load circuit is further configured to receive the RF transmission signal transmitted by the bypass circuit and provide at least one RF output signal according to the RF transmission signal.

* * * * *